(12) United States Patent
Miyairi et al.

(10) Patent No.: US 11,137,123 B2
(45) Date of Patent: Oct. 5, 2021

(54) METHOD OF MANUFACTURING LIGHT EMITTING DEVICE

(71) Applicant: NICHIA CORPORATION, Anan (JP)

(72) Inventors: Hiroshi Miyairi, Yokohama (JP); Shinya Endo, Yokohama (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/006,136

(22) Filed: Aug. 28, 2020

(65) Prior Publication Data

US 2020/0393103 A1  Dec. 17, 2020

Related U.S. Application Data

(63) Continuation of application No. 16/532,255, filed on Aug. 5, 2019, now Pat. No. 10,794,558.

(30) Foreign Application Priority Data

Aug. 6, 2018 (JP) .............................. JP2018-147424
Nov. 9, 2018 (JP) .............................. JP2018-211117

(51) Int. Cl.
*F21S 41/143* (2018.01)
*F21S 41/153* (2018.01)
(Continued)

(52) U.S. Cl.
CPC .............. *F21S 41/143* (2018.01); *F21K 9/64* (2016.08); *F21S 41/153* (2018.01); *F21S 41/36* (2018.01);
(Continued)

(58) Field of Classification Search
CPC ........ F21S 41/143; F21S 41/36; F21S 41/153; F21K 9/64; H01L 33/502; H01L 33/60; F21Y 2115/10
See application file for complete search history.

(56) References Cited

U.S. PATENT DOCUMENTS

2010/0264438 A1  10/2010  Suenaga
2012/0032578 A1   2/2012  Annen et al.
(Continued)

FOREIGN PATENT DOCUMENTS

JP  2009-135485 A   6/2009
JP  2010-272847 A  12/2010
(Continued)

OTHER PUBLICATIONS

Non-Final Office Action on U.S. Appl. No. 16/532,255 dated Mar. 26, 2020.
(Continued)

*Primary Examiner* — Anne M Hines
(74) *Attorney, Agent, or Firm* — Foley & Lardner LLP

(57) ABSTRACT

A method of manufacturing a light emitting device includes: bonding a wavelength conversion sheet containing phosphor particles onto upper surfaces of light emitting elements mounted on a substrate; dividing the wavelength conversion sheet into a plurality of wavelength conversion members, each corresponding to one of the light emitting elements, by cutting from an upper surface of the wavelength conversion sheet; forming light reflecting members between adjacent ones of the wavelength conversion members to reflect light emitted from the light emitting elements; and machining an upper surface of a collective body including the wavelength conversion members and the light reflecting members into a curved surface having a concave shape.

11 Claims, 14 Drawing Sheets

(51) Int. Cl.
*F21S 41/36* (2018.01)
*H01L 33/50* (2010.01)
*H01L 33/60* (2010.01)
*F21K 9/64* (2016.01)
*F21Y 115/10* (2016.01)

(52) U.S. Cl.
CPC ............ *H01L 33/502* (2013.01); *H01L 33/60* (2013.01); *F21Y 2115/10* (2016.08)

(56) References Cited

U.S. PATENT DOCUMENTS

| | | |
|---|---|---|
| 2012/0236582 A1 | 9/2012 | Waragaya et al. |
| 2013/0329440 A1 | 12/2013 | Tsutsumi et al. |
| 2014/0191258 A1 | 7/2014 | Akimoto et al. |
| 2015/0060894 A1 | 3/2015 | Tanaka et al. |
| 2017/0294563 A1 | 10/2017 | Hashimoto |
| 2017/0309798 A1 | 10/2017 | Bonar et al. |
| 2018/0019384 A1 | 1/2018 | Abe |
| 2018/0047880 A1 | 2/2018 | Lim et al. |
| 2018/0123001 A1 | 5/2018 | Hung et al. |
| 2018/0151785 A1 | 5/2018 | Hashimoto |
| 2019/0067533 A1* | 2/2019 | Chen ................ H01L 33/54 |

FOREIGN PATENT DOCUMENTS

| | | |
|---|---|---|
| JP | 2012-156180 A | 8/2012 |
| JP | 2012-169189 A | 9/2012 |
| JP | 2012-195552 A | 10/2012 |
| JP | 2013-065726 A | 4/2013 |
| JP | 2013-077684 A | 4/2013 |
| JP | 2013-172084 A | 9/2013 |
| JP | 2015-008329 A | 1/2015 |
| JP | 2015-050302 A | 3/2015 |
| JP | 2015-065290 A | 4/2015 |
| JP | 2015-185686 A | 10/2015 |
| JP | 2016-092271 A | 5/2016 |
| JP | 2018-010958 A | 1/2018 |
| JP | 2018-085448 A | 5/2018 |
| JP | 2018-092989 A | 6/2018 |
| WO | WO-2018/008197 A1 | 1/2018 |

OTHER PUBLICATIONS

Notice of Allowance on U.S. Appl. No. 16/532,255 dated Jul. 15, 2020.

* cited by examiner

METHOD OF MANUFACTURING LIGHT EMITTING DEVICE

CROSS-REFERENCE TO RELATED APPLICATIONS

The present application is a continuation of U.S. patent application Ser. No. 16/532,255, filed on Aug. 5, 2019, which claims priority to Japanese Patent Application No. 2018-147424, filed on Aug. 6, 2018, and Japanese Patent Application No. 2018-211117, filed on Nov. 9, 2018, the disclosures of which are hereby incorporated by reference in their entireties.

BACKGROUND

The present disclosure relates to a light emitting device.

In recent years, adaptive driving beam (i.e., ADB) headlamps for use in automobiles, capable of illuminating only selected areas, have been developed. The use of adaptive driving beam headlamps as high beam headlamps can avoid light projection to areas where oncoming vehicles and vehicles ahead are present, while allowing them to project light to areas other than those where oncoming vehicles and vehicles ahead are present. This can provide a driver of a vehicle with a good visual field without hindering the visual field of the drivers of other vehicles.

In the light emitting devices used in adaptive driving beam headlamps, multiple light emitting diodes (i.e., LEDs) are mounted on a substrate, and the light emitted from each LED is output in a specific direction by using the optical system of the headlamps. Selectively lighting LEDs allows for irradiation of only selected areas. See, for example, Japanese Patent Publication No. 2015-050302.

These light emitting devices, however, are planar light sources, and thus the impact of the field curvature of a projection lens intensifies from the center of a light source to the peripheral portion, which likely reduces the contrast for the adaptive driving beam headlamps.

SUMMARY

One of the objects of the present disclosure is to provide a light emitting device that can reduce the impact of the field curvature.

According to one embodiment, a light emitting device includes a substrate, light emitting elements mounted on the substrate, wavelength conversion members, and light reflecting members. The wavelength conversion members contain phosphor particles, while being respectively disposed on the light emitting elements. The light reflecting members are disposed between adjacent ones of the wavelength conversion members to reflect light emitted from the light emitting elements. The wavelength conversion members and the light reflecting members are included in a collective body. The collective body has a curved upper surface having a concave shape.

A light emitting device according to another embodiment of the present disclosure includes a substrate, light emitting elements mounted on the substrate, wavelength conversion members, and light shielding members. The wavelength conversion members contain phosphor particles, while being respectively disposed on the light emitting elements. The light shielding members are disposed between adjacent ones of the light emitting elements to block light emitted from the light emitting elements. The wavelength conversion members are included in a collective body. The collective body has a curved upper surface having a concave shape.

Certain embodiments of the present disclosure can provide a light emitting device that can reduce the impact of the field curvature, and a method of manufacturing a light emitting device.

DETAILED DESCRIPTION

Figure 1A:
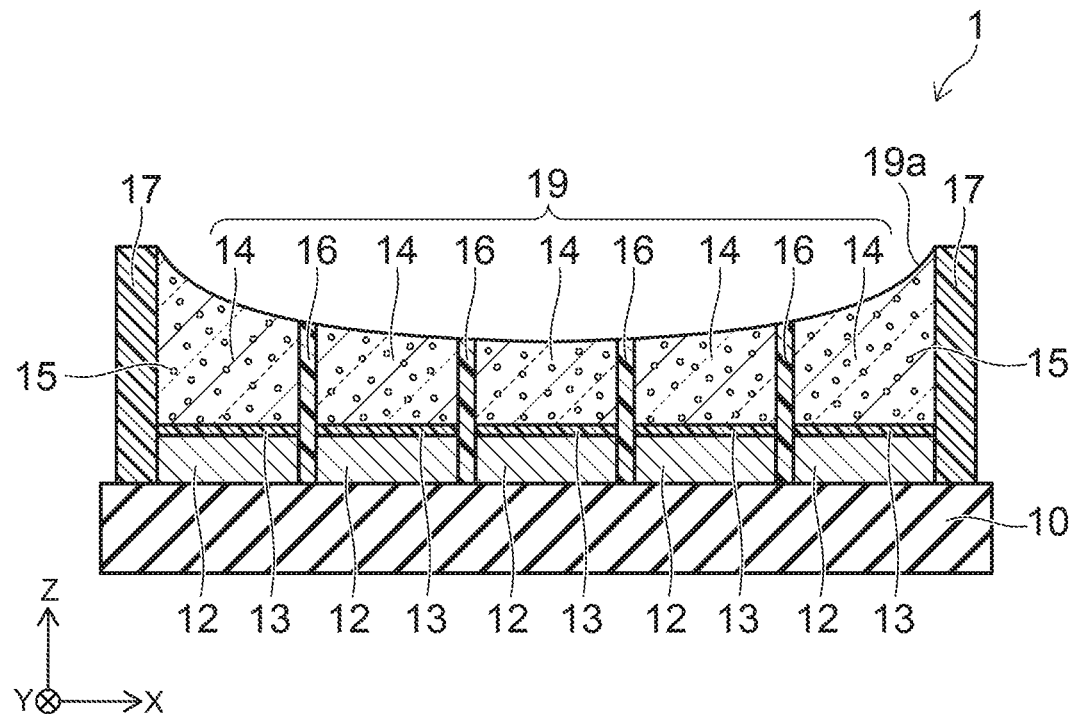
FIG. 1A is an end view of a light emitting device according to a first embodiment.

The embodiments and the variations thereof described below are examples of the present invention, and the present invention is not limited to these embodiments or the variations thereof. For example, the embodiments and the variations described below to, from, or in which a constituent element or step may be added, eliminated, or altered are also encompassed by the present disclosure. Moreover, the embodiments and the variations described below may be implemented in combination.

The drawings referenced in the explanation below show schematic illustrations of the embodiments, and the relative sizes of, positional relationship and spacing between the members might be exaggerated, or certain members might be partially omitted. The scale or spacing of the members between top views and end views might not match on occasion. In the explanation below, as a general rule, the same designations and reference numerals show the same members or those of the same or similar characteristics, for which the detailed explanation will be omitted as appropriate.

In the description herein, for explanation purposes, an XYZ orthogonal coordinate system is adopted. The direction from a substrate to a light emitting element is designated as "Z direction", the direction of the arrangement of the light emitting elements is designated as "X direction", and the direction orthogonal to Z direction and X direction is designated as "Y direction". Of the Z direction, the direction from the substrate to light emitting elements is occasionally referred to as "upwards" and the opposite direction "downwards", but these expressions are for the sake of convenience and have nothing to do with the direction of gravity.

First Embodiment

A first embodiment of the present disclosure will be explained.

Figure 1B:
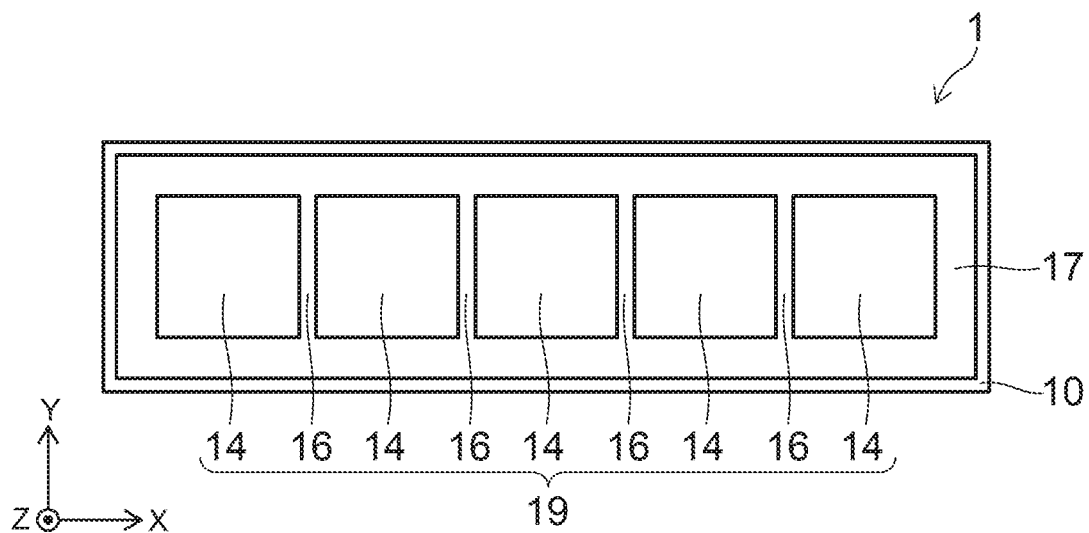
FIG. 1B is a top view of the light emitting device according to the first embodiment.

FIG. 1A is an end view of a light emitting device according to the first embodiment, and FIG. 1B is a top view of the same.

The structure of a light emitting device 1 according to the embodiment will be schematically explained. The light emitting device 1 includes a substrate 10, a plurality of light emitting elements 12, a plurality of phosphor members 14 that are wavelength conversion members, and light reflecting members 16. The light emitting elements 12 are mounted on the substrate 10. Each phosphor member 14 is disposed on each light emitting element 12, and contains phosphor particles 15. The light reflecting members 16 are disposed between adjacent phosphor members 14. The upper surface 19a of the collective body 19 made up of the phosphor members 14 and the light reflecting members 16 is a curved surface having a concave shape.

A detailed explanation will follow. The light emitting device 1 is provided with a substrate 10. The substrate 10 is preferably formed with a material having high thermal conductivity, for example, a ceramic material such as aluminum nitride (AlN), aluminum oxide ($Al_2O_3$), or the like, or a metal such as aluminum (Al), copper (Cu), or the like.

The light emitting elements 12 are flip-chip mounted on the upper surface of the substrate 10. The light emitting elements 12 are connected to the wiring in the substrate 10 via solder bumps or the like. The light emitting elements 12 are LED chips, and emit, for example, blue light. These light emitting elements 12 can be controlled independently of one another. The light emitting elements 12 are arranged in a row at regular intervals, for example. As shown in the examples of eighth, ninth and tenth embodiments described later, the number of light emitting elements 12 is not limited to five as shown in FIG. 1A or other figures, and they may alternatively be arranged rows and columns, but not in only one row.

On the upper surface of each of the light emitting elements 12, a phosphor member 14 serving as a wavelength conversion member is bonded via an adhesive layer 13. The adhesive used to form the adhesive layer 13 is preferably one that is highly resistant to light and heat. For example, a silicone resin or epoxy resin can be used.

The light emitting device includes as many phosphor members 14 as light emitting elements 12. Each of the phosphor members 14 contains a large number of phosphor particles 15. The phosphor members 14 may be a glass sheet or ceramic sheet in which phosphor particles 15 are mixed, or a cured resin material containing phosphor particles 15. The phosphor particles 15, for example, absorb blue light and emit yellow light. Phosphor particles 15 are uniformly distributed in the phosphor members 14.

Light reflecting members 16 are supplied in the spaces between adjacent light emitting elements 12 and between adjacent phosphor members 14. Moreover, a light reflecting wall 17 is provided to surround the light emitting elements 12 and the phosphor members 14. The light reflecting members 16 and the light reflecting wall 17 reflect the blue light emitted by the light emitting elements 12 and the yellow light emitted by the phosphor particles 15. The light reflecting members 16 and the light reflecting wall 17 are integrally formed with a white resin containing a filler, for example. The filler can be, for example, a silicon oxide ($SiO_2$), titanium oxide ($TiO_2$), aluminum (Al), silver (Ag), or the like. The light reflecting members 16 and the light reflecting wall 17 may contain metal powder as long as they do not electrically affect the light emitting elements 12.

The upper surface 19a of the collective body 19 configured with the phosphor members 14 and the light reflecting members 16 is concave at least in part. The curved upper surface 19a refers to a shape, for example, of a portion of a sphere or lateral surface of a cylinder whose generatrix extends in the Y direction. For this reason, the distance between the upper surface of the substrate 10 and the upper surface 19a of the collective body 19 becomes shorter towards the central portion in the X direction of the light emitting device 1 and longer towards both end portions in the X direction. Because the light emitting elements 12 have a substantially uniform thickness in Z direction, the phosphor members 14 disposed in the central portion in the X direction are thinner while the phosphor members 14 disposed at both end portions in the X direction are thicker.

A method of manufacturing a light emitting device according to the embodiment will be explained.

FIG. 2A to FIG. 2C and FIG. 3A to FIG. 3C are end views showing a method of manufacturing the light emitting device according to the embodiment.

Multiple light emitting elements 12 are flip-chip mounted on a substrate 10 via, for example, solder bumps. The light emitting elements 12 are arranged in a row along X direction at regular intervals.

Subsequently, an adhesive layer 13 is applied on the upper surfaces of the light emitting elements 12. At this time, the adhesive layer 13 may enter the spaces between the light emitting elements 12.

Subsequently, a piece of a phosphor sheet 14a is adhered to the upper surfaces of all light emitting elements 12 via the adhesive layer 13. The phosphor sheet 14a is a wavelength conversion sheet. The composition of the phosphor sheet 14a is the same as the composition of the phosphor members 14 described earlier, and phosphor particles 15 are substantially uniformly distributed in the phosphor sheet 14a.

Subsequently, the phosphor sheet 14a is cut per light emitting element 12, for example, by a dicing saw. Accordingly, the phosphor sheet 14a is cut and separated into phosphor members 14 corresponding to the number of the light emitting elements 12. The dicing saw is allowed to pass through the phosphor sheet 14a and to enter into the spaces between the light emitting elements 12, but not to reach the substrate 10. The width of a groove 91 formed by the dicing, in other words, the distance between two phosphor members 14, is set to about 30 microns (μm), for example. The lower end of each groove 91 is set to be close to the substrate 10 to the extent possible, for example, about 20 μm from the substrate 10. This can remove the most part of the adhesive layers 13 entering into the spaces between the light emitting elements 12.

Subsequently, a white resin containing a filler is allowed to be supplied into the grooves 91, and be disposed to surround the light emitting elements 12 and the phosphor members 14, for example, by a molding method. At this time, the white resin is applied up to the upper surfaces of the phosphor members 14. The white resin can spill over the upper surfaces of the phosphor members 14. Then the white resin is hardened. This step forms light reflecting members 16 in the grooves 91 and light reflecting wall 17 surrounding the light emitting elements 12 and the phosphor members 14.

Subsequently, at least a portion of the upper surface 19a of the collective body 19 configured with the phosphor members 14 and the light reflecting members 16 is ground to have a curved surface having a concave shape. The curved surface refers to a shape, for example, of a portion of a sphere or lateral surface of a cylinder whose generatrix extends in the Y direction. However, it does not have to be strictly a portion of a sphere or a portion of lateral surface of a cylinder, as long as it is concave. In this manner, the light emitting device 1 according to the embodiment is manufactured.

Next, the operation and effect of the embodiment will be explained.

Figure 4:
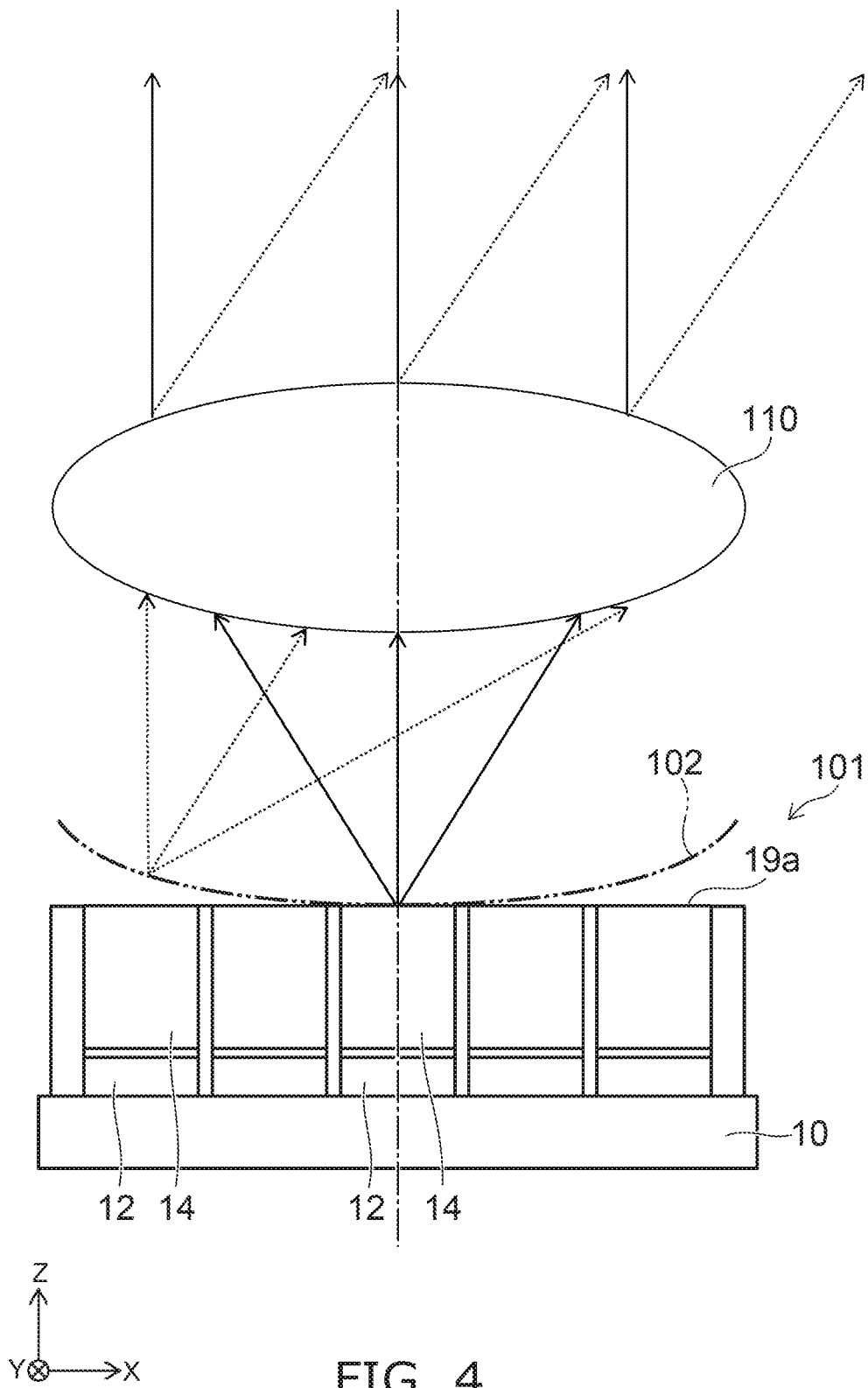
FIG. 4 is an optical model diagram showing the operation of a light emitting device of a comparative example.

FIG. 4 is an optical model showing the operation of the light emitting device of a comparative example.

Figure 5:
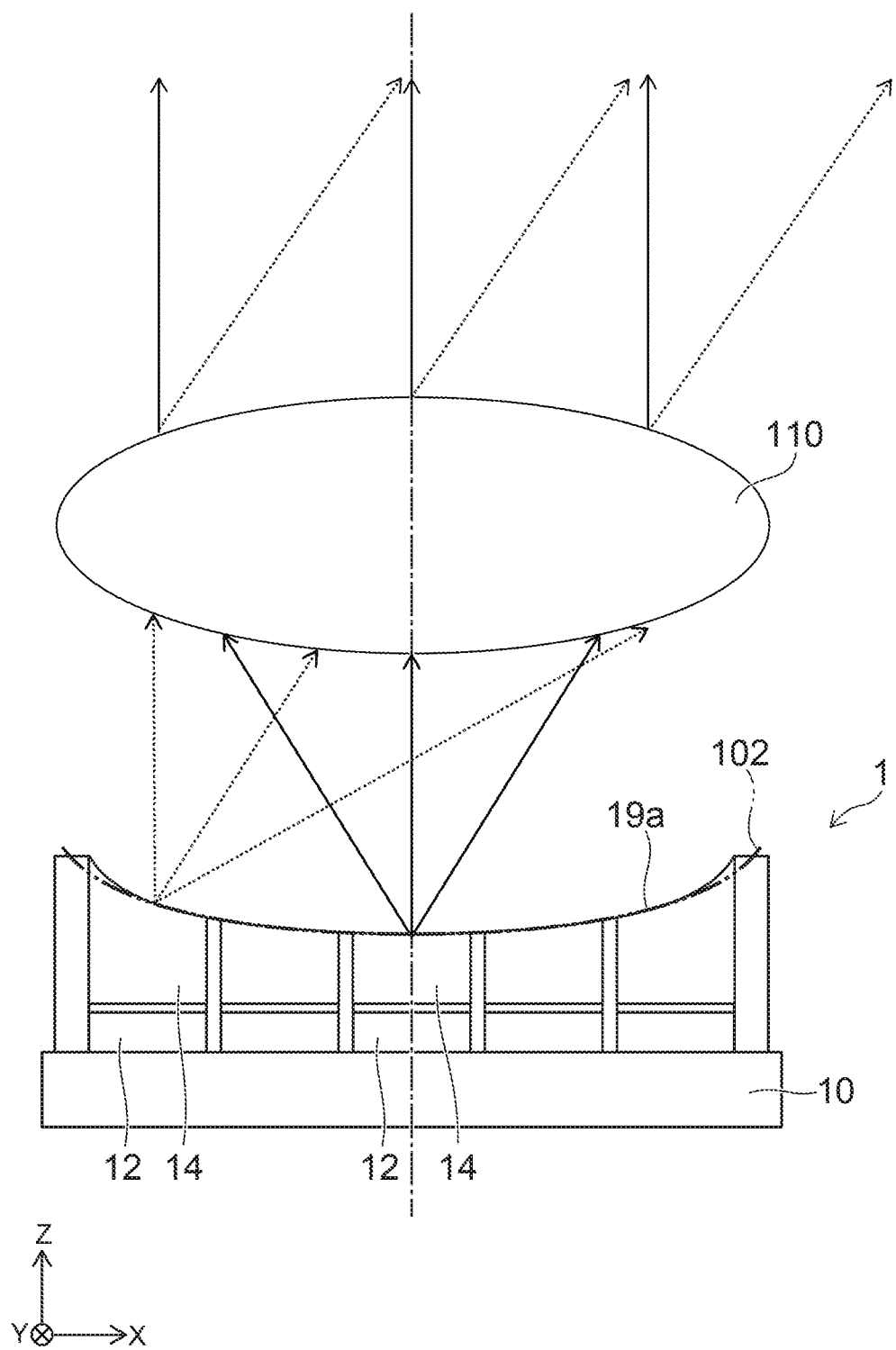
FIG. 5 is an optical model diagram showing the operation of a light emitting device according to the first embodiment.

FIG. 5 is an optical model showing the operation of the light emitting device of the embodiment.

In the light emitting device 1, the light emitting elements 12 emit blue light when turned on. When the blue light enters the phosphor members 14, the phosphor particles 15 absorb the light and emit yellow light. In this manner, white light resulting from mixing the blue light and the yellow light exits from the phosphor members 14.

At this time, because the light reflecting members 16 are provided between the light emitting elements 12 and between the phosphor members 14, the light emitted from one of the light emitting elements 12 enters only one of the phosphor members 14 adhered to the light emitting element 12 substantially without entering the other phosphor members 14. Accordingly, high contrast can be achieved between the phosphor members 14 when the light emitting device 1 is viewed from above.

In the comparative example shown in FIG. 4, the focal points when collimated light rays are converged by the lens 110 are positioned on a virtual curved surface 102. In a light emitting device 101 as a comparative example, the upper surface 19a is flat. Thus, no matter how the light emitting device 101 is positioned relative to the lens 110, the upper surface 19a does not coincide with the curved surface 102. For example, the distance between the light emitting device 101 and the lens 110 may be adjusted so that the light emitted from the phosphor members 14 located in the central portion in the X direction of the light emitting device 101 is collimated by the lens 110. This results in reduced collimation of the light emitted from the phosphor members 14 located at both ends in the X direction of the light emitting device 101 after passing the lens 110. As such, the light emitting device 101 having a flat upper surface 19a is greatly affected by the field curvature.

In contrast, in the case of the embodiment shown in FIG. 5, when the light emitting device 1 is disposed to face the lens 110, the upper surface 19a of the collective body 19 can substantially coincide with the curved surface 102 because the upper surface 19a is curved to be concave. In this manner, the focal points for the collimated light rays entering the lens 110 from the surface facing the light emitting device 1 are positioned above the upper surface 19a in the drawing of FIG. 5.

The light rays spreading from given positions of the upper surface 19a become collimated light rays after passing through the lens 110. The dotted lines with arrowheads shown in FIG. 5 show some of the light rays from a phosphor member 14 located at one end in the X direction of the light emitting device 1, and solid lines with arrowheads show some light rays from the phosphor member 14 positioned in the central portion in the X direction of the light emitting device 1. Both sets of light rays from the phosphor members 14 become substantially parallel after passing the lens 110. Thus, the light rays emitted from the upper surface of the phosphor members 14 become substantially parallel light rays advancing in particular directions after passing the lens 110.

As described above, making the upper surface 19a of the light emitting device 1 concave shape can bring the upper surface 19a close to the curved surface 102. This can reduce the impact of field curvature. As a result, no matter which phosphor member 14 the light rays are emitted from, the lens 110 can make them substantially parallel light rays.

The upper face 10a may have a shape of a part of the lateral surface of a virtual cylinder whose generatrix extending in the Y direction. This can allow the upper face 10a to be highly precisely close to the curved surface 102, thereby increasing collimation of the light rays transmitting through the lens 110. The upper face 19a may have a shape of a part of a virtual sphere. This can allow the upper surface 19a to be highly precisely close to the curved surface 102 in both X direction and Y direction, thereby further increasing collimation of the light rays.

The light emitting element of the embodiment is highly heat resistant because the phosphor members 14 are formed with an inorganic material. Because the phosphor members 14 made is made of an inorganic material, machinability is improved. This facilitates cutting and machining of the upper surface 19a into a curved surface.

Variation of First Embodiment

Next, a variation of the first embodiment will be explained.

Figure 6:
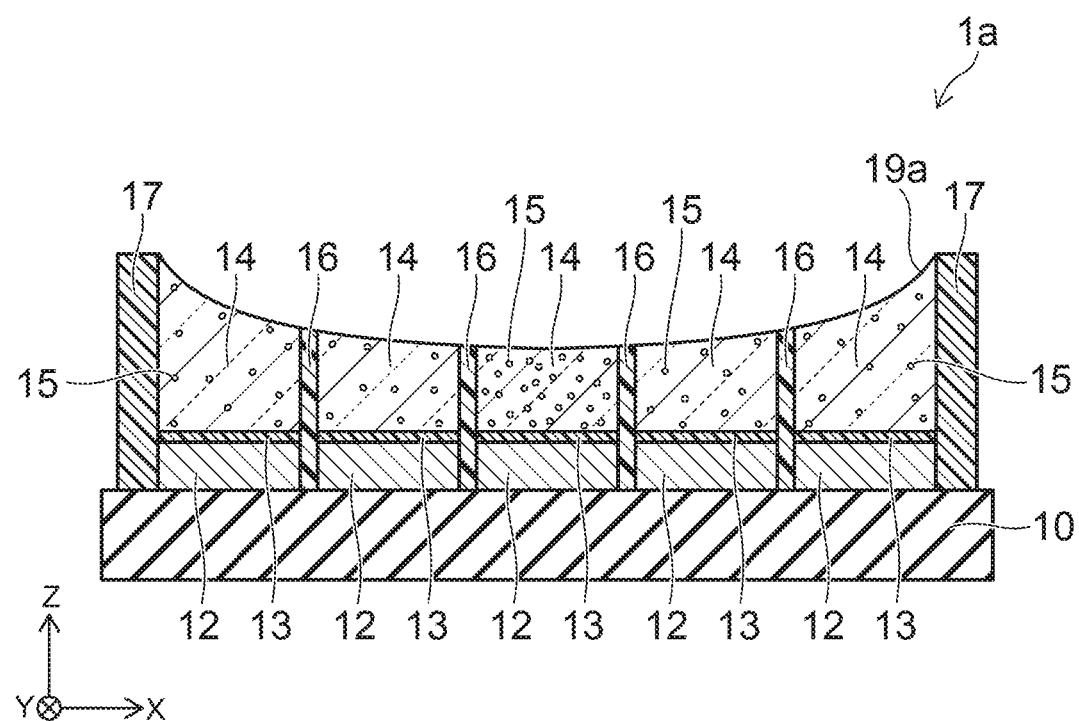
FIG. 6 is an end view of a light emitting device that is a variation of the first embodiment.

FIG. 6 is an end view of the light emitting device according to the variation.

In the explanation below, as a general rule, only the differences from the first embodiment will be explained. Other features not explained below are the same as or a similar to those in the first embodiment. This general rule also applies to the other embodiments and variations explained later.

The light emitting device 1a of the variation differs from the light emitting device 1 of the first embodiment in that the concentration of the phosphor particles 15 in the phosphor members 14 vary among the phosphor members 14.

That is, in the light emitting device 1a, the phosphor particles 15 are contained at a lower concentration as the locations of the multiple phosphor member 14 become closer to both end portions in the X direction the light emitting device 1a. In other words, as the phosphor member 14 has a greater distance between the upper surface of the light emitting element 12 and the upper surface of the phosphor member 14, the phosphor member 14 contains the phosphor particles 15 at lower concentration. For this reason, the concentrations of the phosphor particles 15 in the phosphor members 14 disposed on the light emitting elements 12 mounted at both end portions in the X direction of the substrate 10 are lower than the concentration of the phosphor particles 15 in the phosphor member 14 disposed on the light emitting element 12 in the central portion in the X direction of the substrate 10.

In this variation, the concentrations of the phosphor particles 15 is less as the thicknesses of the phosphor members 14 become greater. This can increase the probability for the light emitted from the light emitting elements 12 to uniformly reach the phosphor particles 15, thereby improving the uniformity of the color of light emitted from the phosphor members 14.

Second Embodiment

A second embodiment of the present disclosure will be explained next.

Figure 7:
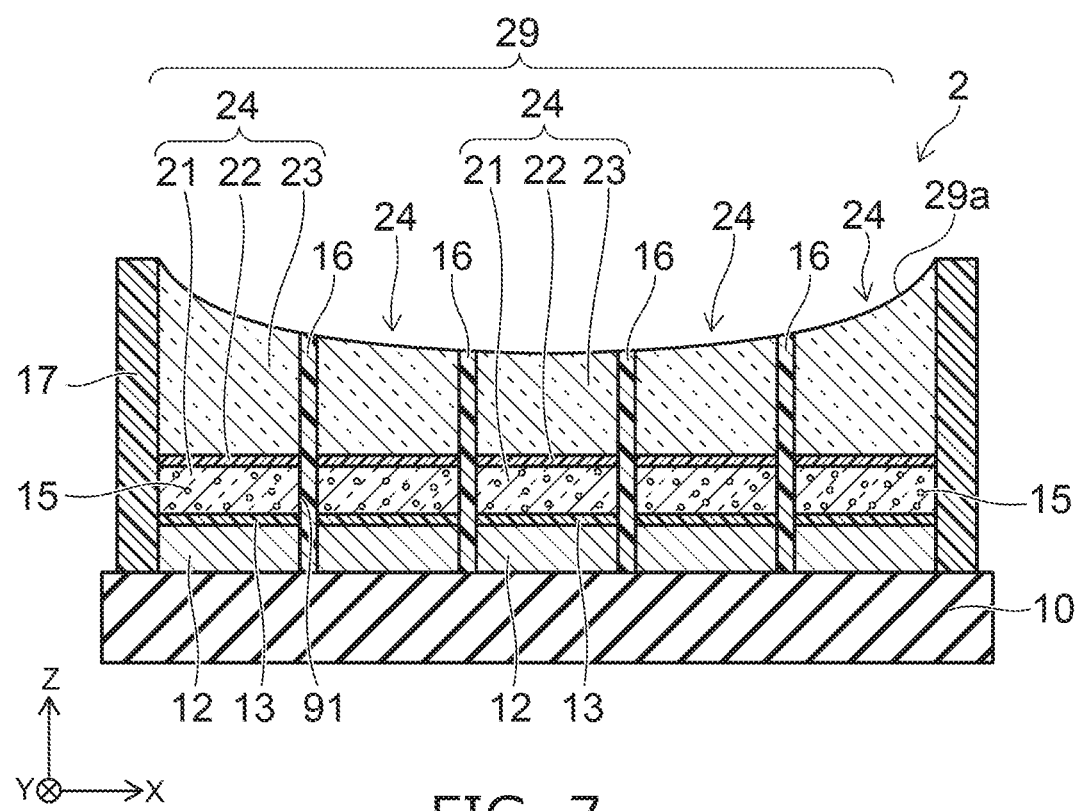
FIG. 7 is an end view of a light emitting device according to a second embodiment.

FIG. 7 is an end view of a light emitting device according to the embodiment.

The light emitting device 2 according to this embodiment differs from the light emitting device 1 of the first embodiment described earlier in that wavelength conversion members 24 are provided in place of the phosphor members 14. The light emitting device 2 includes as many wavelength conversion members 24 as the light emitting elements 12. Each of the wavelength conversion members 24 includes a phosphor member 21, an adhesive layer 22, and a glass member 23.

Specifically, on the upper surface of each light emitting element 12, a phosphor member 21 is bonded using an adhesive layer 13. Each of the phosphor members 21 has substantially the same thickness. In the phosphor members 21, phosphor particles 15 are distributed. Each of the phosphor members 21 contains the phosphor particles 15 at substantially the same concentration. The composition of the phosphor members 21 is the same as the composition of the phosphor members 14 of the first embodiment described earlier, for example.

On each of the phosphor members 21, an adhesive layer 22 is disposed, and a glass member 23 is disposed on the adhesive layer 22. The glass member 23 is bonded to the phosphor member 21 using the adhesive layer 22. The glass members 23 configure the upper surfaces of the wavelength conversion members 24.

The material used for the adhesive layer 22 is, for example, the same as the material user for the adhesive layer 13. The material used for the glass members 23 is, for example, glass, but is not limited thereto. The glass member 23 may be formed using a material having light transmission properties, high machinability, and high thermal resistance and, for example, alumina ($Al_2O_3$) can be used. As described above, the phosphor members 21 and the glass members 23 are formed using an inorganic material, and the adhesive layer 22 is formed using a resin. Thus, the primary component of the wavelength conversion members 24 is an inorganic material.

Similar to the first embodiment, a light reflecting member 16 is disposed between each of the wavelength conversion members 24. The upper surface 29a of the collective body 29 configured with the wavelength conversion members 24 and the light reflecting members 16 is a curved surface having a concave shape.

A method of manufacturing the light emitting device of this embodiment will be explained next.

Figure 8A:
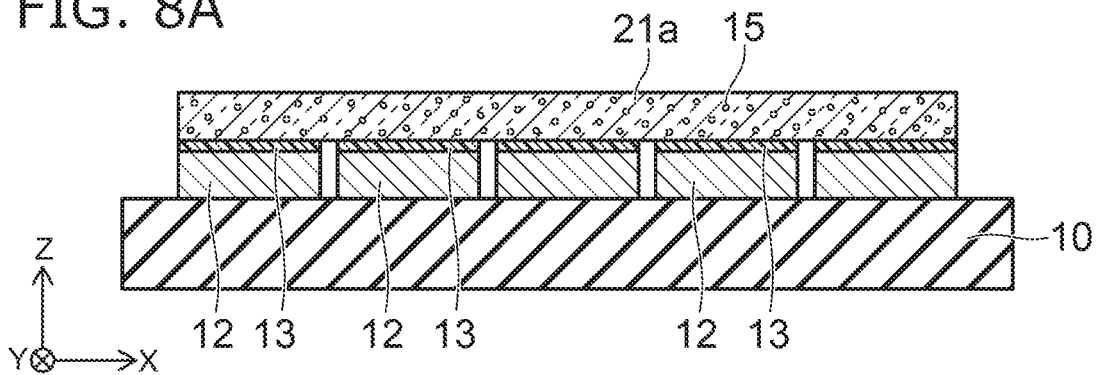
FIG. 8A is an end view showing a method of manufacturing the light emitting device according to the second embodiment.
Figure 8B:
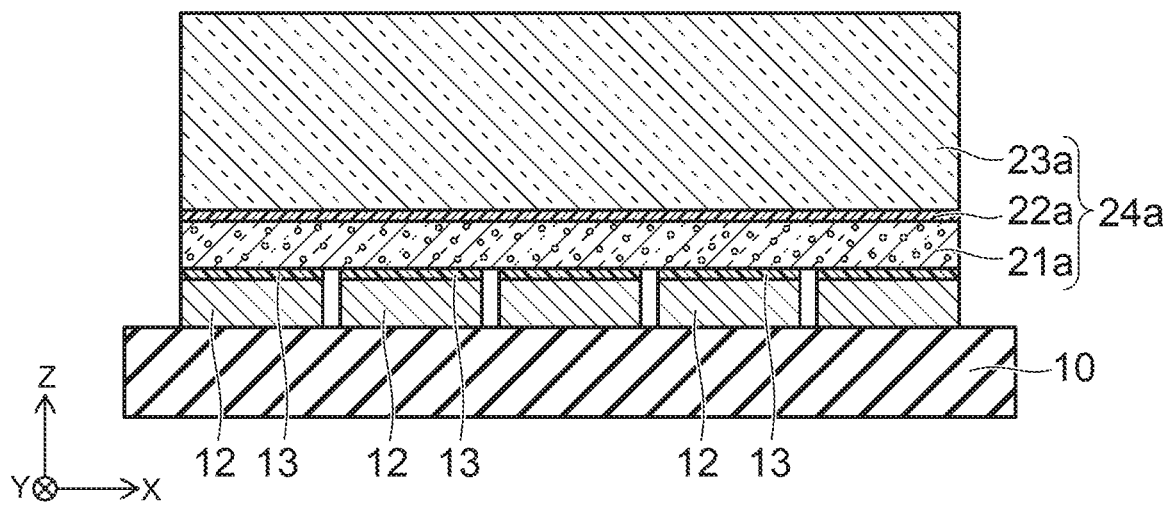
FIG. 8B is an end view showing a method of manufacturing the light emitting device according to the second embodiment.
Figure 8C:
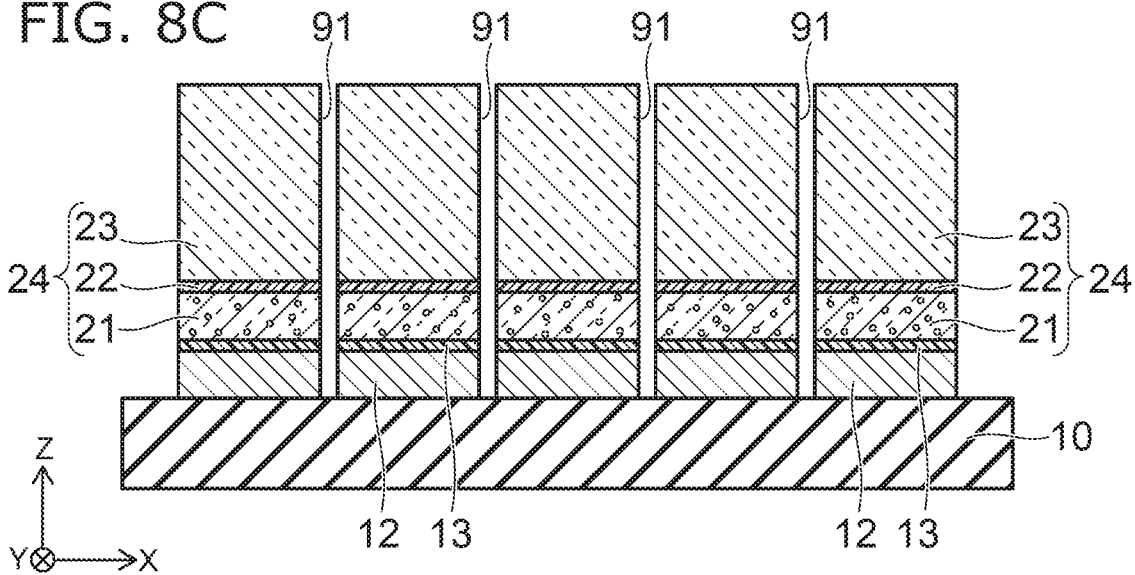
FIG. 8C is an end view showing a method of manufacturing the light emitting device according to the second embodiment.

FIG. 8A to FIG. 8C are end views illustrating a method of manufacturing the light emitting device of this embodiment.

Figure 2A:
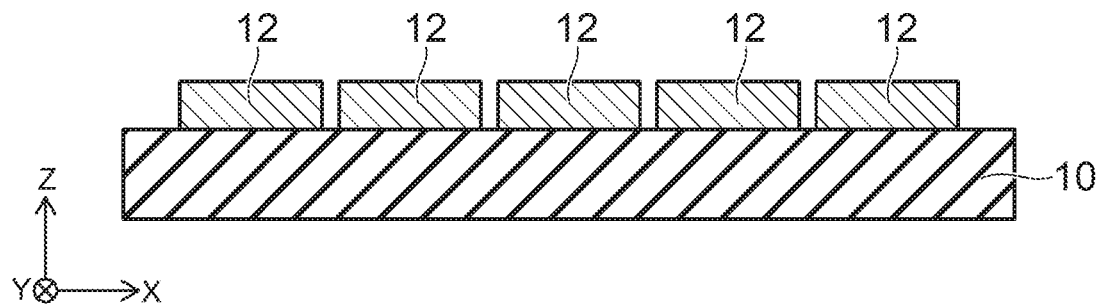
FIG. 2A is an end view showing a method of manufacturing the light emitting device according to the first embodiment.
Figure 2B:
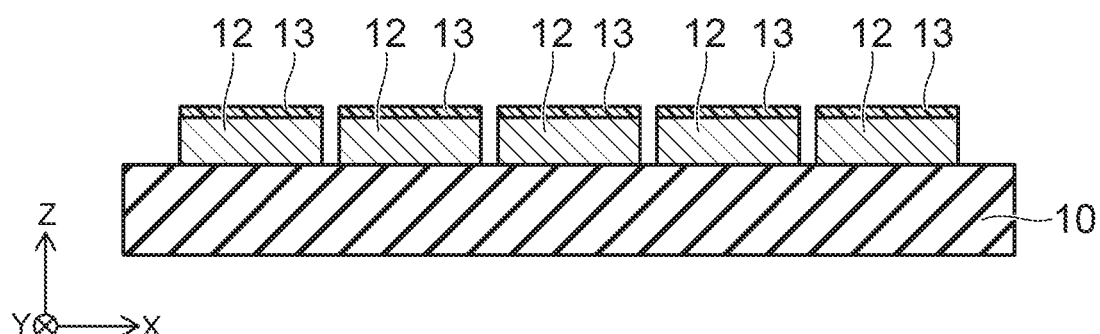
FIG. 2B is an end view showing a method of manufacturing the light emitting device according to the first embodiment.
Figure 2C:
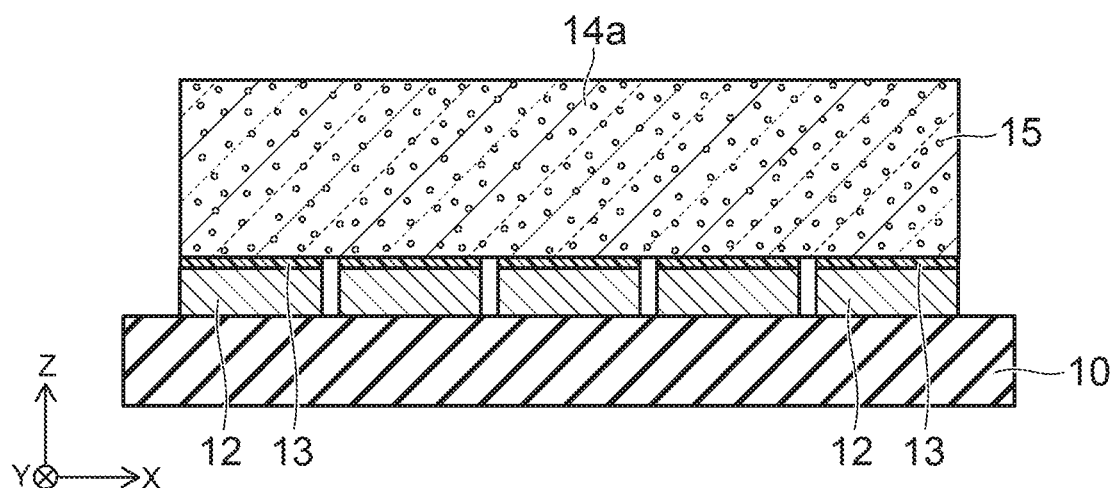
FIG. 2C is an end view showing a method of manufacturing the light emitting device according to the first embodiment.
Figure 3A:
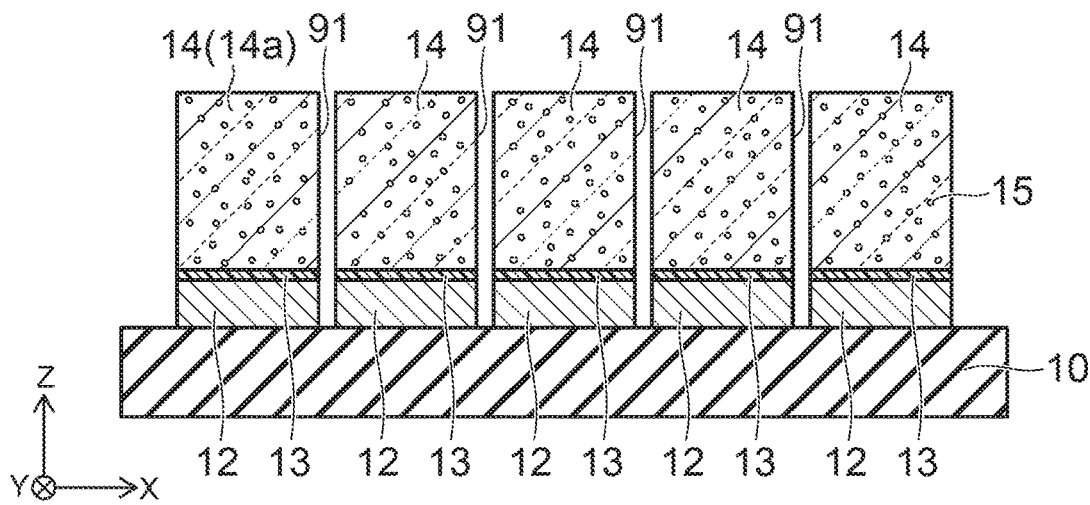
FIG. 3A is an end view showing a method of manufacturing the light emitting device according to the first embodiment.
Figure 3B:
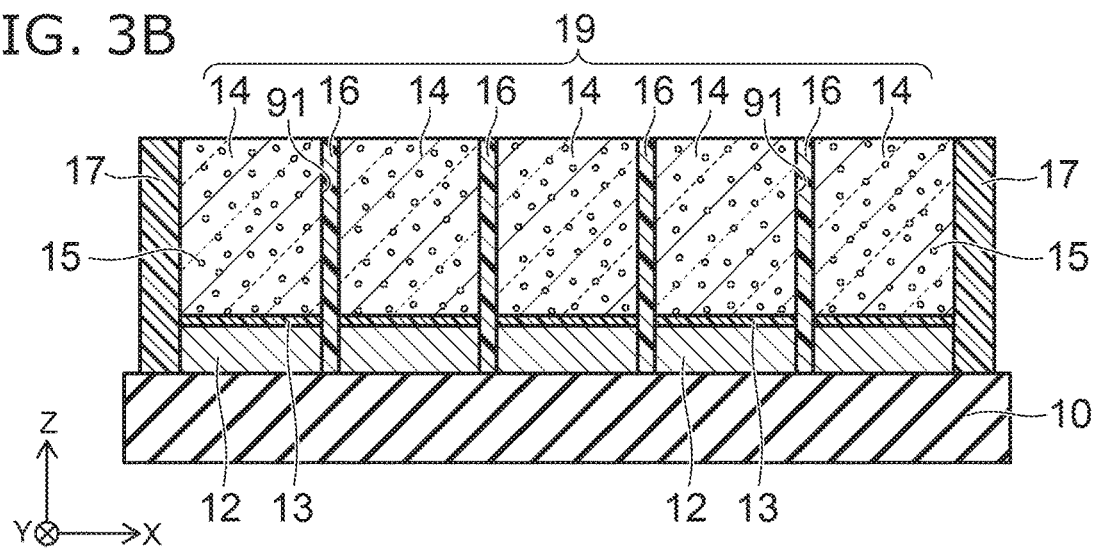
FIG. 3B is an end view showing a method of manufacturing the light emitting device according to the first embodiment.
Figure 3C:
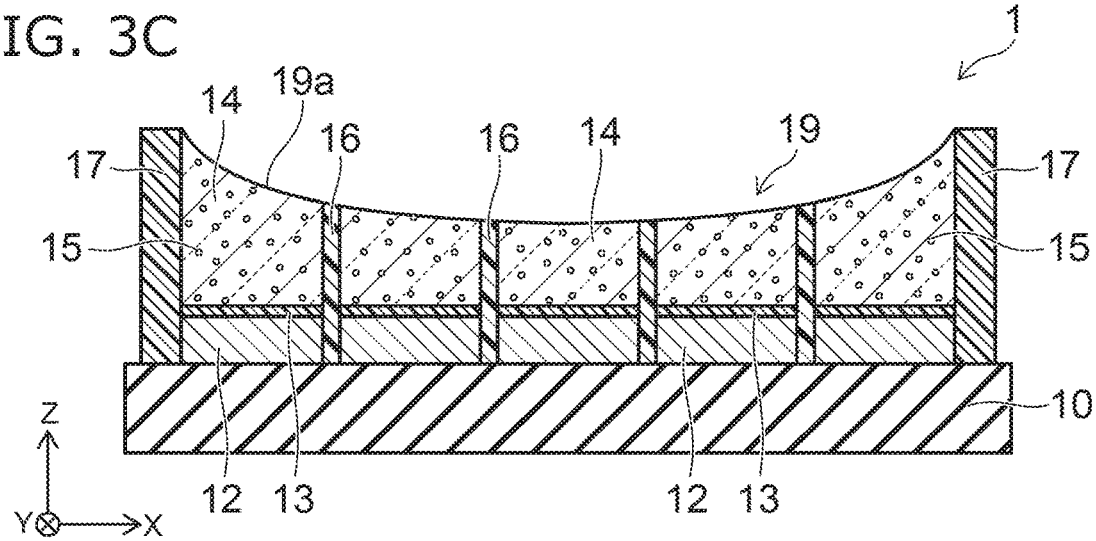
FIG. 3C is an end view showing a method of manufacturing the light emitting device according to the first embodiment.

The steps shown in FIG. 2A and FIG. 2B are performed as described earlier.

Subsequently, a single piece of a phosphor sheet 21a is bonded to the upper surfaces of the light emitting elements 12 via an adhesive layer 13. Phosphor particles 15 are uniformly distributed in the phosphor sheet 21a.

Subsequently, an adhesive layer 22a is formed on the phosphor sheet 21a. Then a glass sheet 23a is adhered to the upper surface of the phosphor sheet 21a via the adhesive layer 22a. In this manner, a wavelength conversion sheet 24a configured with of a phosphor sheet 21a, an adhesive layer 22a and a glass sheet 23a is formed.

Subsequently, the wavelength conversion sheet 24a is cut per light emitting element 12 using, for example, a dicing saw. This creates grooves 91 dividing the wavelength conversion sheet 24a into as many wavelength conversion members 24 as the light emitting elements 12. The cutting conditions are the same as or similar to those described with reference to the first embodiment.

Subsequently, light reflecting members 16 are formed in each of the grooves 91, and a light reflecting wall 17 is formed to surround the light emitting elements 12 and the wavelength conversion members 24.

Then the upper surface 29a of the collective body 29 configured with the wavelength conversion members 24 and the light reflecting members 16 is ground to a curved surface having a concave shape. In this manner, a light emitting device 2 is manufactured.

The effect of this embodiment will be explained next.

In this embodiment, the phosphor members 21 and the glass members 23 are provided in the wavelength conversion members 24 where each of the phosphor members 21 containing phosphor particles 15 has substantially the same thickness, and the upper surfaces of the glass members 23 not substantially containing phosphor particles 15 form a concave surface. In this manner, the emission color can be made uniform even when the concentrations of the phosphor particles 15 in the phosphor members 21 are uniform. This can eliminate the need to vary the concentration of the phosphor particles 15 by the location in the phosphor sheet 21*a* for the purpose of improving emission color uniformity, thereby simplifying the manufacturing process for the light emitting device 2.

Minute surface roughness may be formed on the upper surfaces of the glass members 23 by blasting or the like. With this structure, light is scattered at the upper surfaces of the glass members 23. This can make the light emitting device 2 appears as if the light occur at the upper surfaces of the glass members 23 when the light emitting device 2 is viewed externally, thereby improving the collimation precision of the lens 110.

Third Embodiment

A third embodiment of the present disclosure will be explained next.

Figure 9:
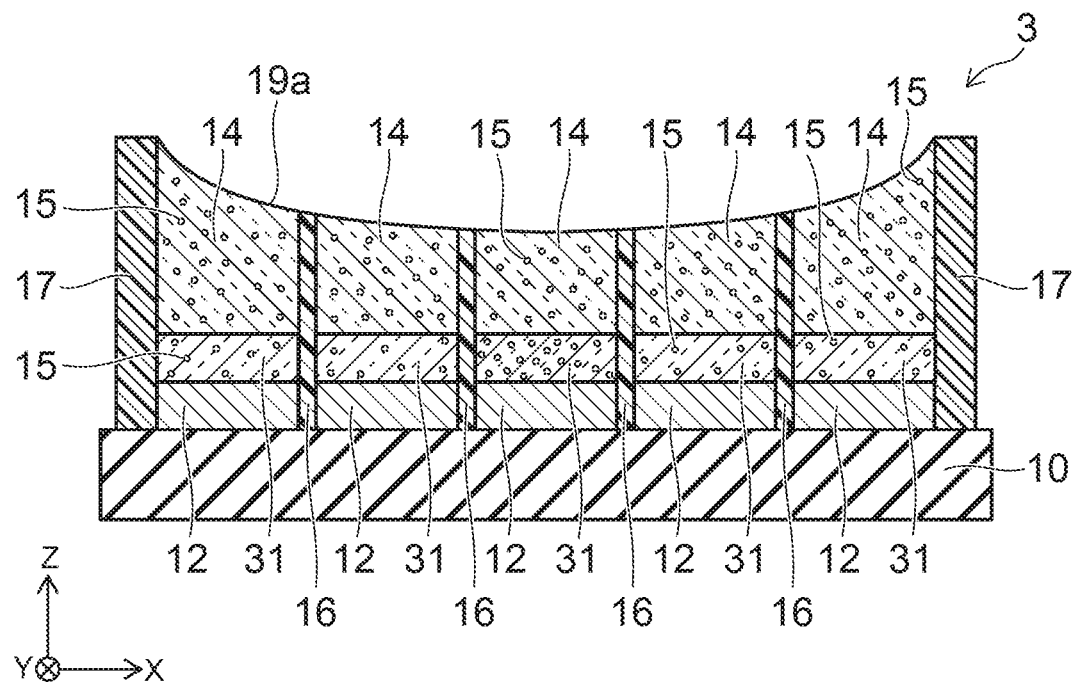
FIG. 9 is an end view of a light emitting device according to a third embodiment.

FIG. 9 is an end view of a light emitting device according to this embodiment.

The light emitting device 3 of this embodiment differs from the light emitting device 1 of the first embodiment described earlier in that an adhesive layer 31 is disposed in place of the adhesive layer 13.

The adhesive layer 31 contains phosphor particles 15. The adhesive layer 31 contains the phosphor particles 15 at a higher concentration in the central portion in the X direction of the light emitting device 3, and at lower concentrations towards both end portions in the X direction. That is, the concentration of the phosphor particles 15 in the adhesive layer 31 disposed on the light emitting elements 12 mounted at both end portions in the X direction of the substrate 10 is lower than the concentration of the phosphor particles 15 in the adhesive layer 31 on the light emitting element 12 mounted in the central portion in the X direction of the substrate 10. The concentration of the phosphor particles 15 in the phosphor member 14 is uniform among the phosphor members 14.

The method of manufacturing a light emitting device of this embodiment differs from the method of the first embodiment in that an adhesive layer 31 is applied in place of an adhesive layer 13.

The operation and effect of this embodiment will be explained next.

In this embodiment, the adhesive layer 31 employed to adhere the phosphor members 14 to the light emitting elements 12 contains phosphor particles 15, and the adhesive layer 31 contains the phosphor particles at different concentrations such that the concentration in the central portion is high and the concentration at both ends in the X direction. This allows the concentration difference of the phosphor particles 15 in the adhesive layer 31 to compensate for color shift of emitted light attributable to the thickness difference of the phosphor members 14. This can eliminate the need to vary the concentration of the phosphor particles 15 by the location in the phosphor sheet 14*a* for the purpose of improving color uniformity of emitted light, thereby consequently simplifying the manufacturing of the light emitting device 3.

Fourth Embodiment

A fourth embodiment of the present disclosure will be explained next.

Figure 10:
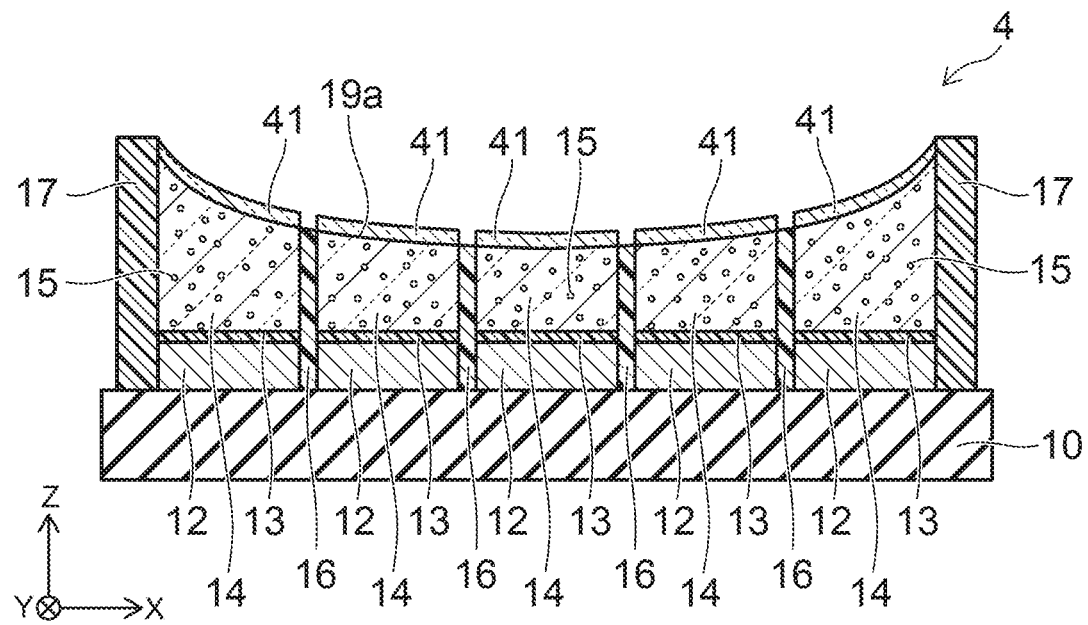
FIG. 10 is an end view of a light emitting device according to a fourth embodiment.

FIG. 10 is an end view of a light emitting device according to this embodiment.

In the light emitting device 4 of this embodiment, a dielectric multilayer film 41 is disposed on the upper surfaces of the phosphor members 14 in addition to the components of the light emitting device 1 of the first embodiment described earlier. The dielectric multilayer film 14 is, for example, a distributed Bragg reflector (DBR).

The film structure of the dielectric multilayer film 41 differs depending on the location, where the transmittance with respect to blue light is low in the portion of the dielectric multilayer film 41 located in the central area in the X direction while the transmittance with respect to blue light becomes higher towards the areas at both ends in the X direction. That is, the dielectric multilayer film 41 located at both ends in the X direction of the substrate 10 has higher transmittance with respect to the light emitted from the light emitting elements 12 than that of dielectric multilayer film 41 located in the central portion in the X direction of the substrate 10.

A method of manufacturing the light emitting device of this embodiment will be explained next.

Steps in this embodiment are similar to those for the first embodiment, and the upper surface 19*a* of the collective body 19 is machined into a curved surface having a concave shape. At this time, the upper surface 19*a* is finished to have a mirror surface to the extent possible.

Subsequently, a dielectric multilayer film 41 is formed on the upper surfaces of the phosphor members 14. At this time, the dielectric multilayer film 41 is selectively formed multiple times while masking regions where the dielectric multilayer film is not intended to be formed using masking tapes or the like, and changing the masked regions. This can achieve formation of multiple types of the dielectric multilayer film 41 with different film structures. In this manner, the light emitting device 4 of this embodiment is manufactured.

The operation and effect of the embodiment will be explained next.

In this embodiment, a dielectric multilayer film 41 is disposed on the phosphor members 14 where the dielectric multilayer film 41 located in the central portion in the X direction has low transmittance with respect to blue light and the dielectric multilayer film 41 located towards both ends in the X direction has higher transmittance with respect to blue light. In this manner, the emission color shift attributable to different thicknesses of the phosphor members 14 can be compensated for by the varied blue light transmittance of the dielectric multilayer film 41. This can eliminate the need to vary the concentration of phosphor particles 15 in the phosphor sheet 14*a* for the purpose of improving emission color uniformity, thereby simplifying the manufacturing of the light emitting device 4.

Fifth Embodiment

A fifth embodiment of the present disclosure will be explained next.

Figure 11:
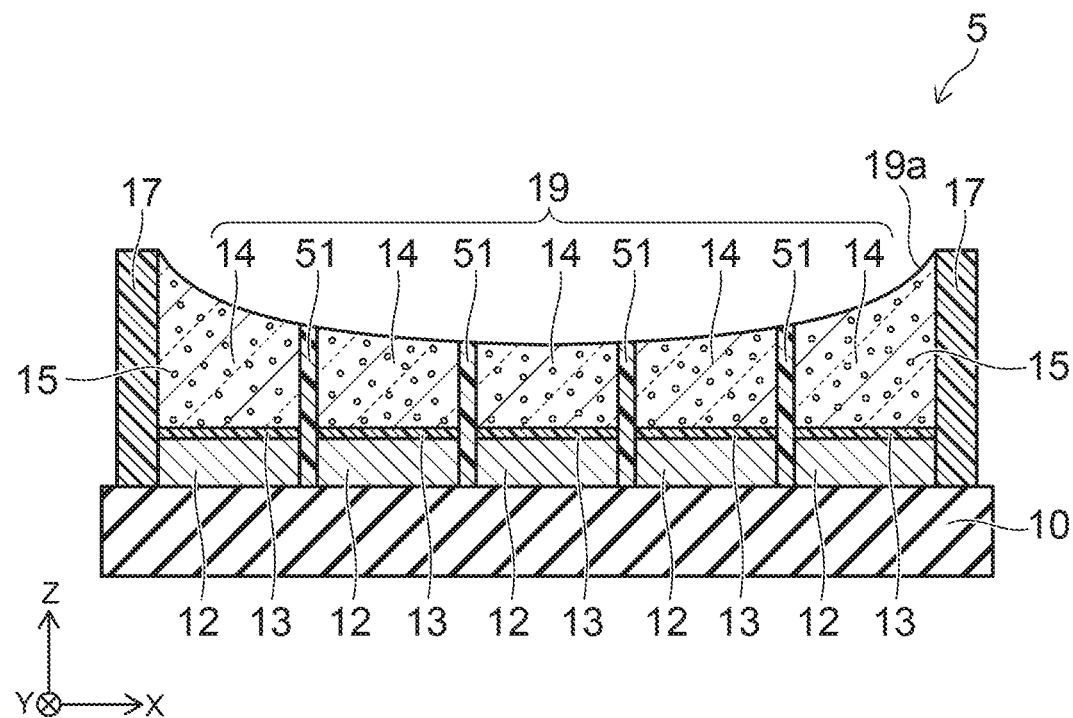
FIG. 11 is an end view of a light emitting device according to a fifth embodiment.

FIG. 11 is an end view of a light emitting device of the embodiment.

The light emitting device 5 of this embodiment differs from the light emitting device 1 of the first embodiment described earlier in that light blocking members 51 are disposed in place of the light reflecting members 16. The light shielding members 51 are disposed at least between the light emitting layers of the light emitting elements 12 and are, for example, disposed between the light emitting elements 12, between the adhesive layers 13, and between the phosphor members 14. The light shielding members 51 substantially completely block light, and are formed, for example, from a black insulating material.

A method of manufacturing a light emitting device of this embodiment will be explained next.

After performing the steps shown in FIG. 2A to FIG. 3A, light shielding members 51 are formed in the grooves 91. Then light reflecting wall 17 is formed to surround the collective body, which includes the light emitting elements 12, the phosphor members 14, and the light shielding members 51. A frame-shaped light shielding member 51 may be disposed in place of the light reflecting wall 17. Subsequently, at least one portion of the upper surface 19a of the collective body 19 is ground into a curved surface having a concave shape. In this manner, the light emitting device 5 is manufactured.

The operation and effect of this embodiment will be explained next.

According to this embodiment, the light shielding members 51 disposed between the light emitting elements 12 can substantially block light between the light emitting elements 12 even when the distances between the light emitting elements are small. This can inhibit the light from the turned-on light emitting elements 12 from leaking onto the light turned-off emitting elements 12, even when improving the density of the light emitting elements 12 in the light emitting device. Accordingly, it is attenuated that the phosphor members 14 on the turned-on light emitting elements 12 weakly illuminates. As a result, the contrast between the turned-on regions and the turned-off regions can be enhanced.

Sixth Embodiment

A sixth embodiment of the present disclosure will be explained next.

Figure 12:
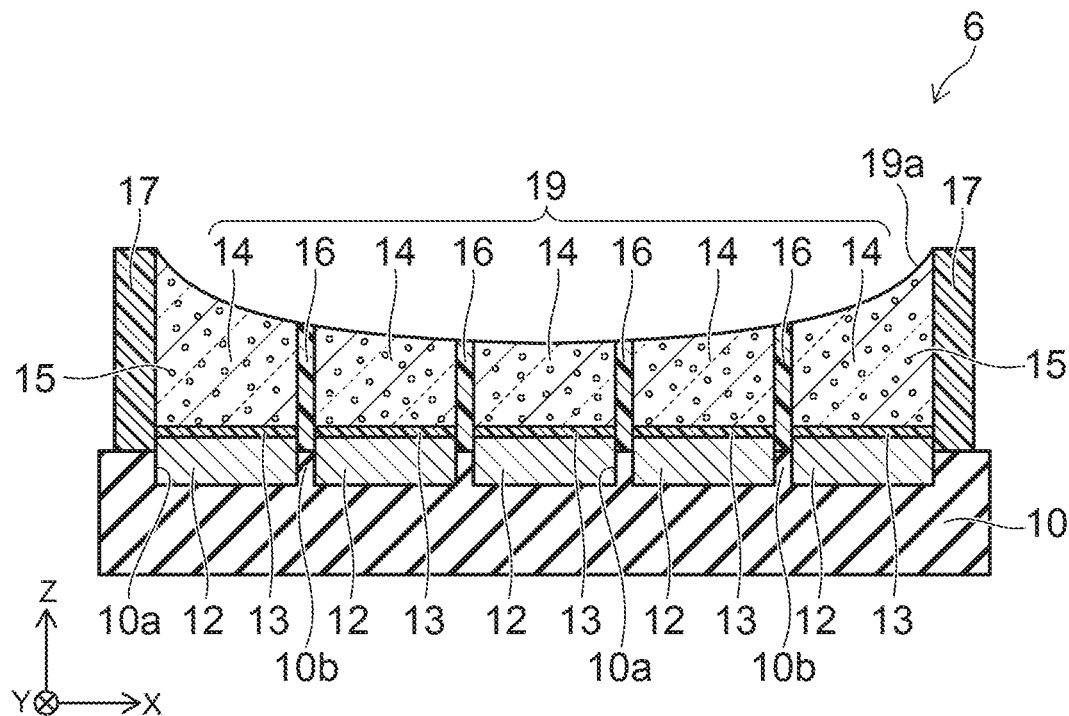
FIG. 12 is an end view of a light emitting device according to a sixth embodiment.

FIG. 12 is an end view of a light emitting device according to this embodiment.

The light emitting device 6 according to this embodiment differs from the light emitting device 1 of the first embodiment described earlier in that recesses 10a are formed on the upper surface of the substrate 10 and the light emitting elements 12 are respectively disposed in the recesses 10a. For example, the recesses 10a as many as the light emitting elements 12 are formed on the substrate, and each light emitting element 12 is disposed in a recess 10a. At least the emission layer of each light emitting element 12 is located in the recess 10a. Portions 10b between the recesses 10a of the substrate 10 are thus located between the emission layers of the light emitting elements 12.

The light emitting elements 12 may be entirely located in the recesses 10a. All of the light emitting elements 12, the adhesive layers 13, and the phosphor members 14 may be located in the recesses 10a. In this case, the portions 10b between the recesses 10a of the substrate 10 are exposed at the upper surface 10a.

The operation and effect of the embodiment will be explained next.

According to this embodiment, the portions 10b of the substrate 10 interposed between the emission layers of the light emitting elements 12 function as shielding members, thereby substantially block light between the light emitting elements 12. This can enhance the contrast between turned-on regions and turned-off regions even when the density of the light emitting elements 12 in the light emitting device is increased.

Seventh Embodiment

A seventh embodiment of the present disclosure will be explained next.

Figure 13:
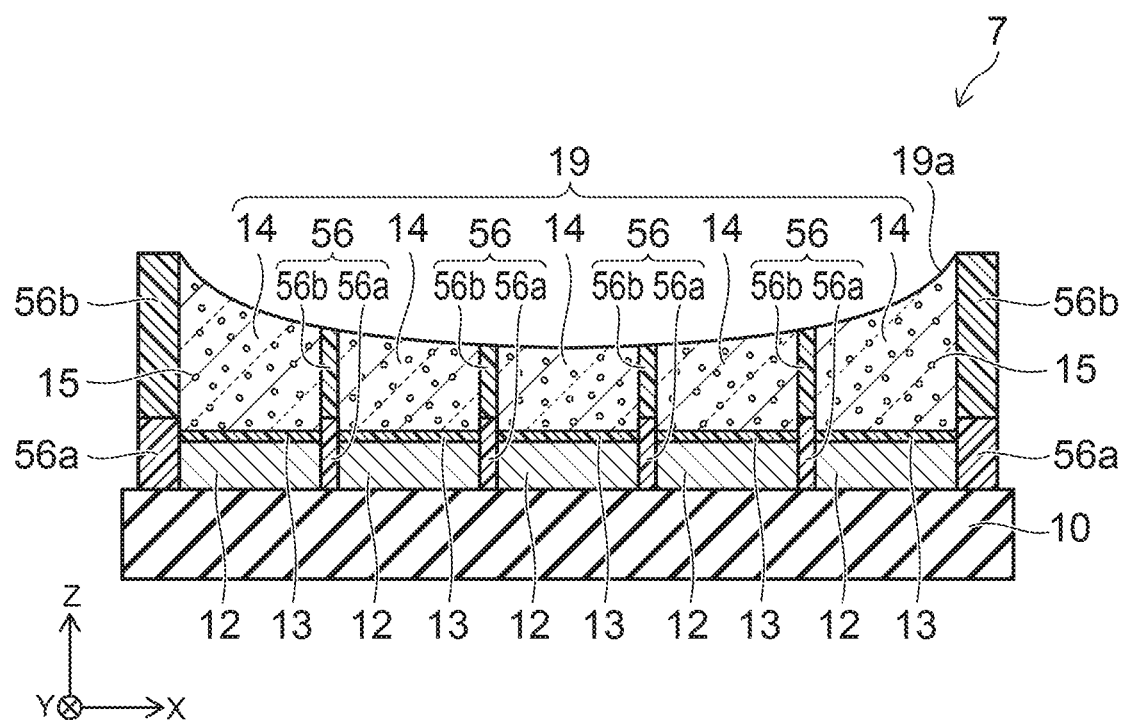
FIG. 13 is an end view of a light emitting device according to a seventh embodiment.

FIG. 13 is an end view of a light emitting device of the embodiment.

The light emitting device 7 of this embodiment differs from the light emitting device 1 of the first embodiment described earlier in that resin layers 56 are disposed in place of the light reflecting members 16 and the light reflecting wall 17. The resin layers 56 are formed using a resin containing various types of fillers where the filler contents differ between the lower portions 56a and the upper portions 56b of the resin layers 56. The lower portions 56a of the resin layers 56 contains more fillers having high absorptance. On the other hand, the upper portions 56b of the resin layers 56 contains more fillers having high reflectance. The lower portions 56a cover at least the emission layers of light emitting elements 12. The upper portions 56b are located between the phosphor members 14, for example. However, the borders between the lower portions 56a and the upper portions 56b are necessarily be clearly recognizable.

A method of manufacturing the light emitting device of the embodiment will be explained next.

After performing the steps illustrated in FIG. 2A to FIG. 3A, a resin containing several kinds of fillers having different specific gravities is supplied to fill the grooves 91 and surround the light emitting elements 12 and the phosphor members 14. At this time, the resin is supplied to the heights of the upper surfaces of the phosphor members 14. The resin is then left standing for a certain duration to allow the fillers having higher specific gravities and high absorptance to settle to be concentrated in the lower portions of the resin, while allowing the fillers having lower specific gravities and high reflectance to rise to be concentrated in the upper portions of the resin. The resin is subsequently allowed to harden to form the resin layers 56 in the grooves 91, and the areas surrounding the light emitting elements 12 and the phosphor members 14. Subsequently, at least one portion of the upper surface 19a of the collective body 19 configured with the light emitting elements 12, the adhesive layers 13, the phosphor members 14, and the resin layers 56 is ground into a curved surface having a concave shape. In this manner, the light emitting device 7 is manufactured.

The operation and effect of the embodiment will be explained next.

According to the embodiment, the lower portions 56a of the resin layers 56 having high absorptance is interposed between the emission layers of the light emitting elements 12, thereby functioning as light shielding members. Thus, light between the light emitting elements 12 can substantially be blocked. This can attenuate leakage of light between the light emitting elements 12 as well as enhancing the contrast between the turned-on regions and turned-off regions even when the density of the light emitting elements 12 in the light emitting device is increased. Moreover, because the upper portions 56b of the resin layers 56 having high reflectance are interposed between the phosphor members 14, the light entering the phosphor members 14 from the light emitting elements 12 can be efficiently extracted.

Eighth Embodiment

An eighth embodiment of the present disclosure will be explained next.

Figure 14A:
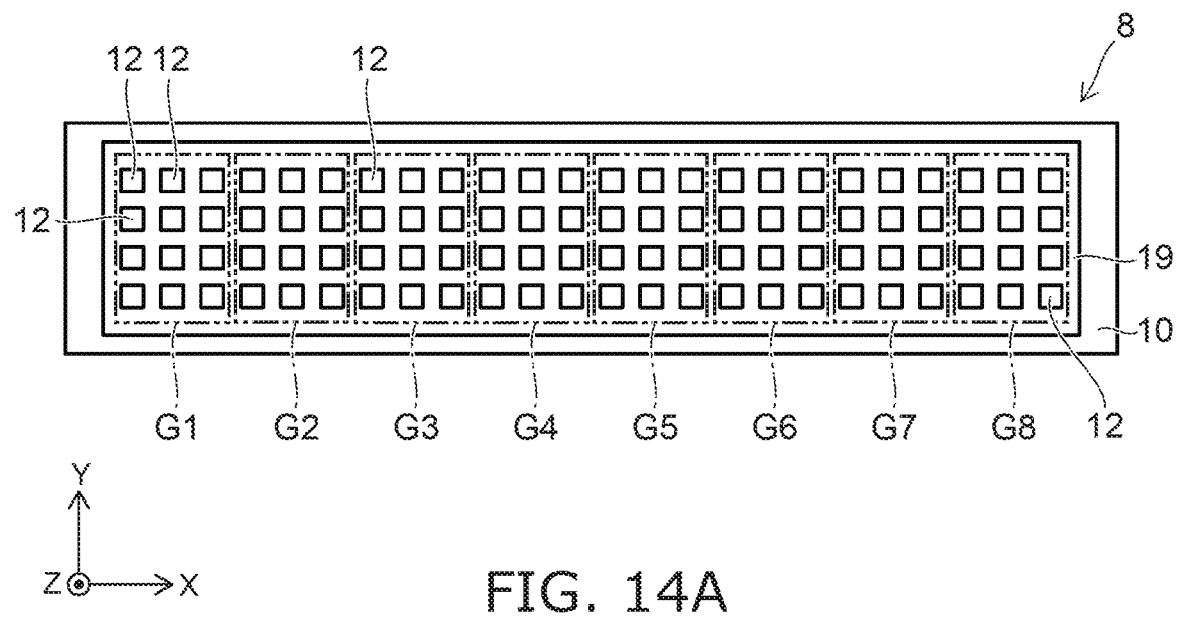
FIG. 14A is a top view of a light emitting device according to an eighth embodiment.
Figure 14B:
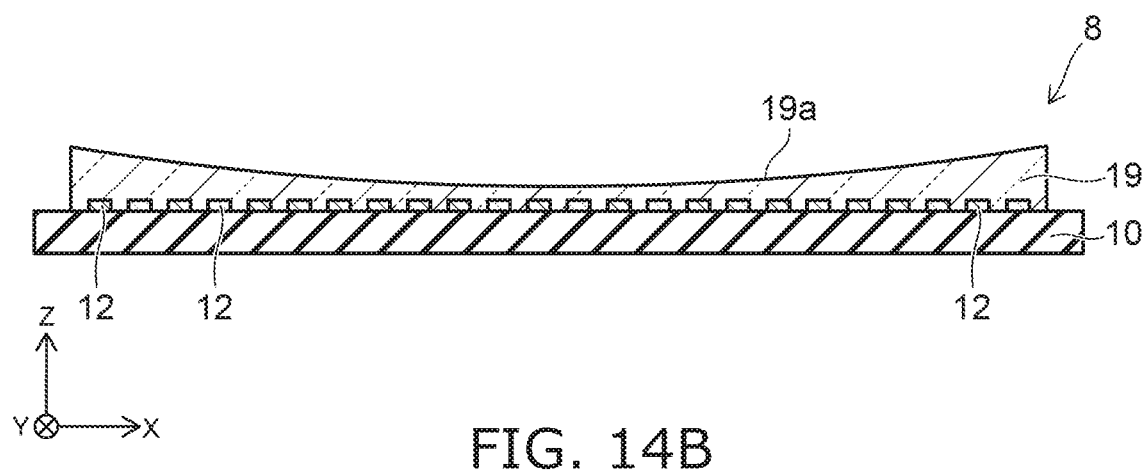
FIG. 14B is an end view of the light emitting device according to the eighth embodiment viewed in the short side direction.
Figure 14C:
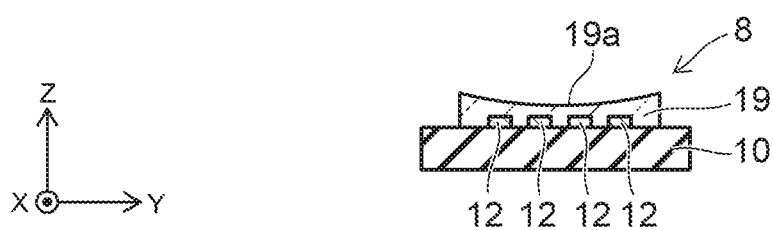
FIG. 14C is an end view of the light emitting device according to the eighth embodiment viewed in the longitudinal direction.

FIG. 14A is a top view of a light emitting device of the embodiment, FIG. 14B is an end view seen in the short side direction, FIG. 14C is an end view seen in the long side direction. FIG. 14A, FIG. 14B, and FIG. 14C show the state where the upper surface 19a has a shape of a portion of a sphere. The curvature of the upper surface 19a in FIG. 14B is the same as the curvature of the upper surface 19a in 14C, but the curvature of the upper surface 19a in FIG. 14C is exaggerated for ease of explanation.

In the light emitting device 8 of this embodiment, for example, ninety-six light emitting elements 12 are disposed in a matrix of 24 columns in the X direction at regular intervals and 4 rows in the Y direction at regular intervals. Twelve light emitting elements 12 arranged in three adjacent columns along X direction form one group. That is, in the light emitting device 8, the ninety-six light emitting elements 12 are divided into 8 groups G1 to G8.

A collective body 19 is disposed on the light emitting elements 12. Similar to the first embodiment, the upper surface 19a of the collective body 19 is a concave surface, whose shape is, for example, a portion of a sphere. The substrate 10 has a length of, for example, about 30 mm in the X direction, and the length of, for example, about 5 mm in the Y direction. The concave on the upper surface 19a of the collective body 19 has the depth of, for example, about 3 mm.

Similar to the first embodiment described earlier, the collective body 19 is configure with phosphor members 14 and light reflecting members 16. The phosphor members 14 may be disposed per light emitting element 12. In this case, the number of phosphor members 14 is ninety-six. Alternatively, the phosphor members 14 may be provided per group. In this case, the number of phosphor members 14 is eight.

A usage example of the light emitting device of this embodiment will be explained next.

Figure 15:
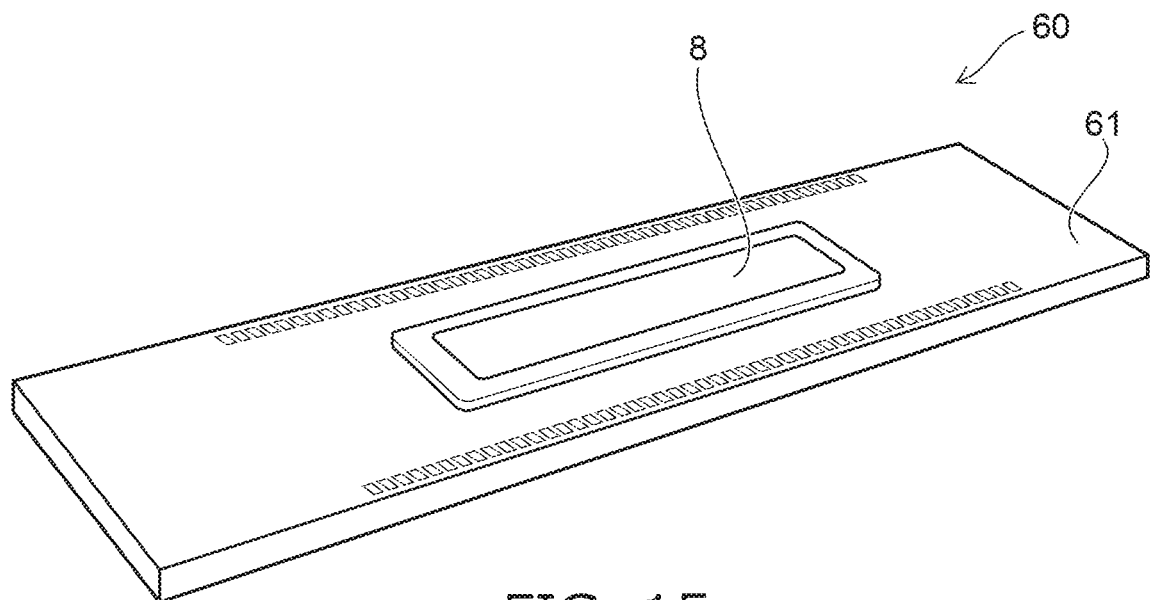
FIG. 15 is a perspective view of a high beam unit equipped with the light emitting device according to the eighth embodiment.

FIG. 15 is a perspective view of a light source unit in which the light emitting device of the embodiment is mounted.

Figure 16:
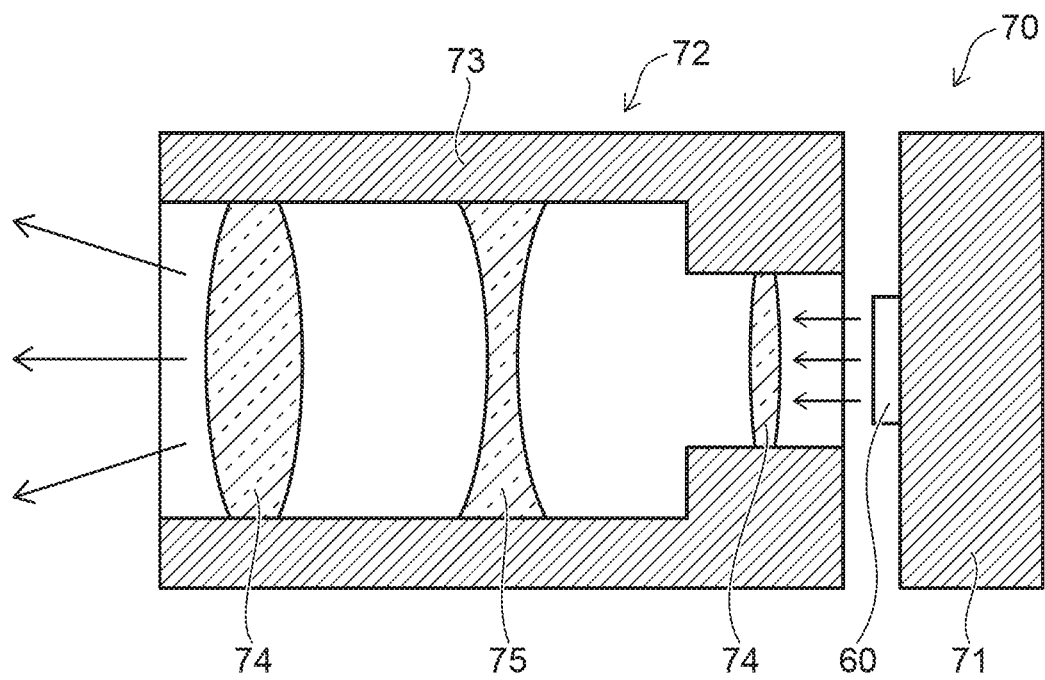
FIG. 16 is an end view of the high beam unit equipped with the light emitting device according to the eighth embodiment.

FIG. 16 is an end view of a high beam unit in which the light emitting device of the embodiment is mounted.

Figure 17:
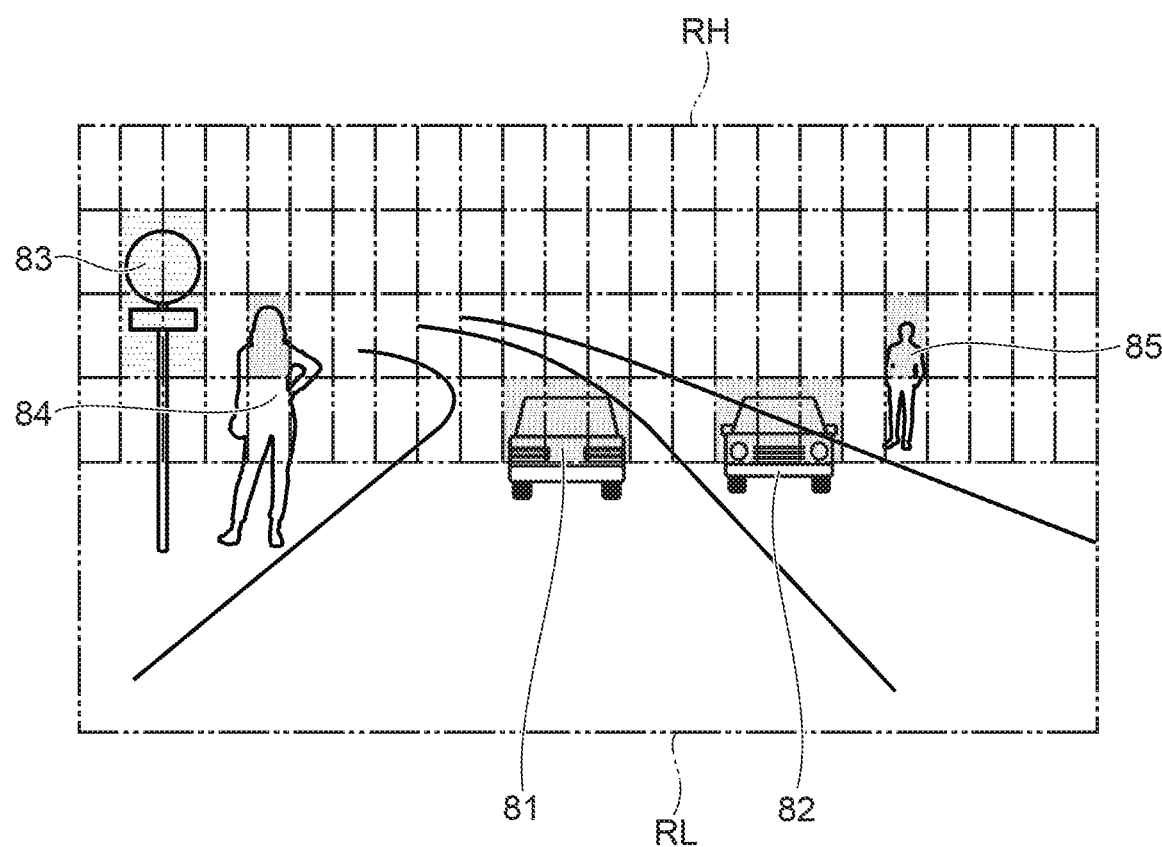
FIG. 17 is a diagram showing the operation of a headlamp equipped with the light emitting device according to the eighth embodiment.

FIG. 17 is a diagram showing the operation of the headlamp in which the light emitting device of the embodiment is mounted.

The light emitting device 8 of the embodiment is mounted in a light source unit 60. In the light source unit 60, the light emitting device 8 is mounted on a mounting substrate 61.

The light source unit 60 is mounted in a high beam unit 70. In the high beam unit 70, a heatsink 71 is disposed, and the mounting substrate 61 of the light source unit 60 is bonded to the heat sink 71. An optical system 72 is provided on the side of the light source unit 60. In the optical system 72, one or more convex lenses 74 and one or more concave lenses 75 are disposed in a housing 73. These lenses correspond to the lens 110 shown in FIG. 5. The optical system 72 outputs the light entering from each light emitting element 12 or each group of the light emitting device 8 in directions that are different from one another. The high beam unit 70 may be provided with a control circuit to control the light emitting elements 12 per light emitting element 12 or pixel. The high beam unit 70 is installed with a low beam unit, a small lamp unit, or the like, to configure an automotive headlamp.

FIG. 17 is a schematic diagram of a view seen by a driver of a vehicle. The headlamps of the embodiment are each provided with a low beam unit, a high beam unit 70, and a small lamp unit. The low beam unit is not an ADB headlamp, and thus projects light to the entire low beam region RL.

On the other hand, the high beam unit 70 is an ADB headlight. The high beam unit 70 can project light only to a given region by on/off controlling the light emitting elements 12 individually or per pixel. Accordingly, the high beam region RH is divided into as many regions as the light emitting elements 12, in other words, four rows in the vertical direction times twenty four columns in the horizontal direction, totaling ninety-six regions, and a selection as to whether to project light can be made for each region.

For example, the high beam unit 70 can project light to areas other than the rear window of a vehicle ahead 81. The high beam unit 70 can project light to areas other than the windshield of an oncoming vehicle 82. The high beam unit 70 can project dimmed light to a road sign 83 to reduce glare caused by reflection. The high beam unit 70 can emphasize the presence of pedestrians 84 and 85 by projecting more intense light to their bodies without projecting light to their heads. In this manner, the visibility of the driver of a vehicle can be improved without blinding the driver of the vehicle ahead 81 or the driver of the oncoming vehicle 82, or the pedestrians 84 and 85. Furthermore, it can illuminate the road further ahead.

The effect of the embodiment will be explained next.

In this embodiment, because the upper surface 19a of the collective body 19 is curved to form a concave, the light rays passing the lens can be highly collimated. For this reason, when used as a light source for an ADB headlight, the light emitting device 8 can increase the luminous intensity difference between illuminated regions and unilluminated regions without installing a primary lens in the optical system 72 of the high beam unit 70, thereby improving prevention of the blinding relative to vehicles ahead and oncoming vehicles. As a result, the structure of the optical system 72 can be simplified while facilitating reduction in size, cost, and light utilization efficiency of the optical system 72. The components, manufacturing methods, operation, and effect of the embodiment other than those described above are the same as or similar to those of the first embodiment explained earlier.

Ninth Embodiment

A ninth embodiment of the present disclosure will be explained next.

Figure 18:
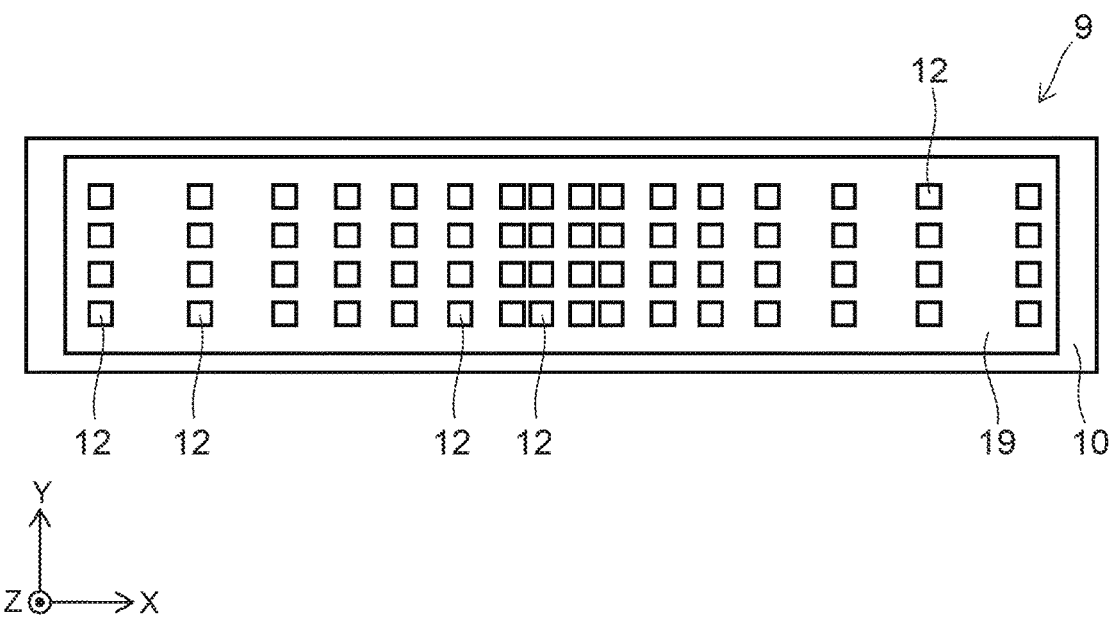
FIG. 18 is a top view of a light emitting device according to a ninth embodiment.

FIG. 18 is a top view of a light emitting device of the embodiment.

In the light emitting device 9 of the embodiment, multiple light emitting elements 12 are arranged on the substrate 10 in the X direction and Y direction. The light emitting elements 12 are arranged at irregular intervals in the X direction, specifically, they are arranged at small intervals in the central portion in the X direction, and at larger intervals at both end portions in the X direction.

According to this embodiment, the light emitting device 9 mounted in the high beam unit of an automobile can illuminate the central portion of the visual field more brightly than the peripheral area of the central portion. This can allow the high beam unit 70 to have increased resolution in the central portion of the visual field, thus light distribution can highly precisely be controlled relative to an oncoming vehicle distanced further away. The arrangement of the light emitting elements 12 is not required to the example described in this embodiment, and can be suitably adjusted in accordance with the light distribution requirements of a vehicle.

The components, operation, and effect of the embodiment other than those described above are the same as or similar to those of the eighth embodiment described earlier.

Tenth Embodiment

A tenth embodiment of the present disclosure will be explained next.

Figure 19:
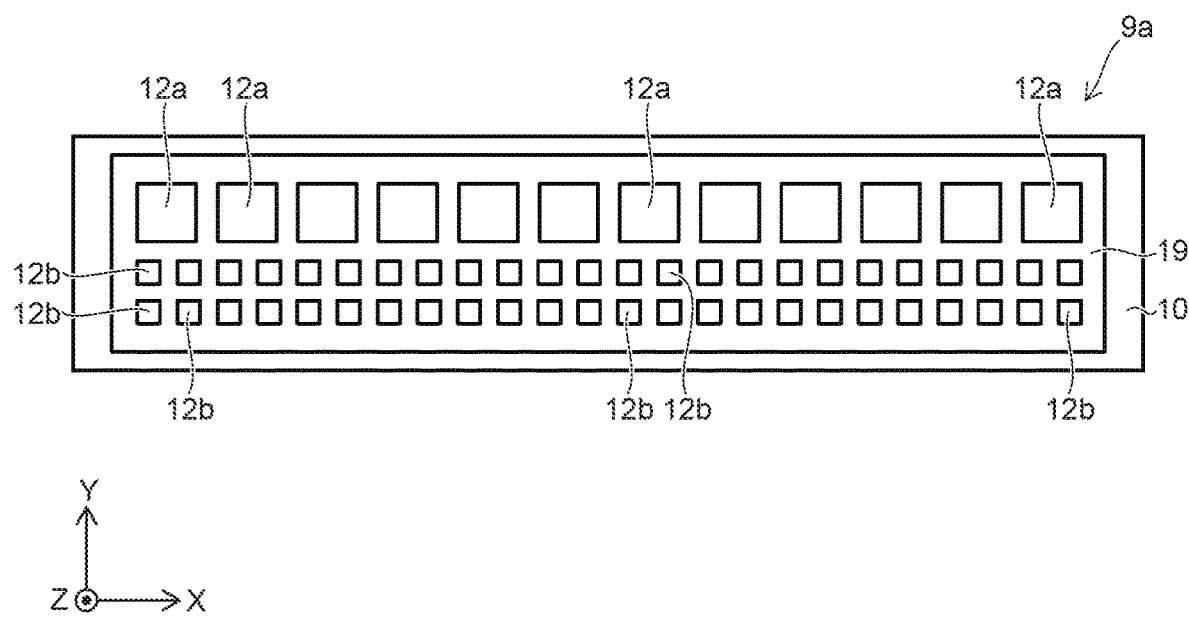
FIG. 19 is a top view of a light emitting device according to a tenth embodiment.

FIG. 19 is a top view of a light emitting device of the embodiment.

In the light emitting device 9a of this embodiment, two types of light emitting elements 12a and 12b are provided. The light emitting elements 12a and 12b are mounted on the same substrate 10, and the light emitting elements 12a are larger than the light emitting elements 12b. For example, twelve light emitting elements 12a are arranged in a row along X direction, and forty-eight light emitting elements 12b are arranged in a matrix of twenty-four columns along X direction at regular intervals and two rows along Y direction at regular intervals.

According to the embodiment, the light emitting device 9a mounted in a high beam unit of a vehicle can provide different projection regions between the upper portion and the lower portion of the high beam region RH. This makes it possible to more precisely control of the light distribution for the lower portion of the high beam region RH, which includes a vehicle traveling ahead or an oncoming vehicle at close distance, by using smaller projection regions, while more efficiently illuminating the upper portion of the high beam region RH, which includes traffic signs and terrains such as cliffs, by using larger projection regions.

In this embodiment, although an example that employs two types of light emitting elements having different sizes has been explained, the light emitting elements are not limited to this configuration, and three or more types of light emitting elements may be provided. Moreover, multiple types of light emitting elements that differ in terms of emission color may be employed. This can vary the color of light in accordance with the direction of projected light. As described above, multiple types of light emitting elements mounted on the same substrate 10 can achieve a finer light distribution design corresponding to projection directions.

The components, operation, and effect of the embodiment other than those described above are the same as or similar to those of the eighth embodiment described earlier.

In the eighth to tenth embodiments described above, examples of applying the light emitting devices to ADB headlamps have been illustrated, but the scope of application of the light emitting devices is not limited to these. For example, they can be applied to spotlights or projectors for projection mapping. In these cases, the emission colors of the light emitting elements 12 may be varied per light emitting element or pixel.

The present disclosure can be utilized as a light source for lighting fixture such as headlamps, spotlights, or the like, as well as a light sources for display devices such as for projection mapping or the like.

What is claimed is:

1. A method of manufacturing a light emitting device, the method comprising:
    bonding a wavelength conversion sheet containing phosphor particles onto upper surfaces of light emitting elements mounted on a substrate;
    dividing the wavelength conversion sheet into a plurality of wavelength conversion members, each corresponding to one of the light emitting elements, by cutting from an upper surface of the wavelength conversion sheet;
    forming light reflecting members between adjacent ones of the wavelength conversion members to reflect light emitted from the light emitting elements; and
    machining an upper surface of a collective body including the wavelength conversion members and the light reflecting members into a curved surface having a concave shape.

2. The method of manufacturing a light emitting device according to claim 1, wherein:
    the wavelength conversion sheet comprises an inorganic material as a main component.

3. The method of manufacturing a light emitting device according to claim 1, wherein:
    the wavelength conversion sheet comprises:
        a glass sheet that forms the upper surface of the wavelength conversion sheet, and
        a phosphor sheet containing the phosphor particles disposed between the light emitting elements and the glass sheet.

4. The method of manufacturing a light emitting device according to claim 1, wherein:
    in the step of bonding the wavelength conversion sheet, the light emitting elements and the wavelength conversion sheet are bonded using an adhesive layer containing phosphor particles.

5. The method of manufacturing a light emitting device according to claim 1, further comprising:
    forming at least one dielectric multilayer film on upper surfaces of the wavelength conversion members that have been machined to form the curved surface having the concave shape.

6. A method of manufacturing a light emitting device, the method comprising:
    bonding a wavelength conversion sheet containing phosphor particles onto upper surfaces of light emitting elements mounted on a substrate;
    dividing the wavelength conversion sheet into a plurality of wavelength conversion members, each corresponding to one of the light emitting elements, by cutting from an upper surface of the wavelength conversion sheet;
    forming light shielding members between adjacent ones of the light emitting elements to block light emitted from the light emitting elements; and
    machining an upper surface of a collective body including the wavelength conversion members into a curved surface having a concave shape.

7. The method of manufacturing a light emitting device according to claim 6, wherein:
    the wavelength conversion sheet comprises an inorganic material as a main component.

8. The method of manufacturing a light emitting device according to claim 6, wherein:
    the wavelength conversion sheet comprises:
        a glass sheet that forms the upper surface of the wavelength conversion sheet, and
        a phosphor sheet containing the phosphor particles disposed between the light emitting elements and the glass sheet.

9. The method of manufacturing a light emitting device according to claim 6, wherein:

in the step of bonding the wavelength conversion sheet, the light emitting elements and the wavelength conversion sheet are bonded using an adhesive layer containing phosphor particles.

10. The method of manufacturing a light emitting device according to claim 6, further comprising:
forming at least one dielectric multilayer film on upper surfaces of the wavelength conversion members that have been machined to form the curved surface having the concave shape.

11. A method of manufacturing a light emitting device, the method comprising:
bonding wavelength conversion members comprising an inorganic material as a main component and containing phosphor particles, onto upper surfaces of light emitting elements mounted on a substrate; and
machining upper surfaces of the wavelength conversion members to form a curved surface having a concave shape.

* * * * *